United States Patent
Song et al.

(10) Patent No.: US 8,349,075 B2
(45) Date of Patent: Jan. 8, 2013

(54) 2-DIMENSIONAL LINE-DEFECTS CONTROLLED SILICON INGOT, WAFER AND EPITAXIAL WAFER, AND MANUFACTURING PROCESS AND APPARATUS THEREFOR

(75) Inventors: Do-Won Song, Gumi-si (KR); Young-Hun Kim, Gumi-si (KR); Eun-Sang Ji, Gumi-si (KR); Young-Kyu Choi, Busan (KR); Hwa-Jin Jo, Gumi-si (KR)

(73) Assignee: Siltron Inc., Gumi (KR)

( * ) Notice: Subject to any disclaimer, the term of this patent is extended or adjusted under 35 U.S.C. 154(b) by 0 days.

(21) Appl. No.: 13/328,132

(22) Filed: Dec. 16, 2011

(65) Prior Publication Data
US 2012/0132131 A1 May 31, 2012

Related U.S. Application Data

(62) Division of application No. 12/256,663, filed on Oct. 23, 2008, now Pat. No. 8,114,215.

(30) Foreign Application Priority Data

Dec. 28, 2007 (KR) .................. 10-2007-0140430

(51) Int. Cl.
C30B 15/14 (2006.01)
C30B 11/00 (2006.01)
C30B 15/00 (2006.01)
C30B 21/06 (2006.01)
C30B 27/02 (2006.01)
C30B 28/10 (2006.01)
C30B 30/04 (2006.01)
C30B 35/00 (2006.01)

(52) U.S. Cl. ............... 117/32; 117/3; 117/11; 117/200; 117/206
(58) Field of Classification Search ............... 117/3, 11, 117/32, 200, 206
See application file for complete search history.

(56) References Cited

U.S. PATENT DOCUMENTS

| | | | | |
|---|---|---|---|---|
| 6,156,119 | A * | 12/2000 | Hoshi et al. | 117/30 |
| 6,565,822 | B1 * | 5/2003 | Hoshi et al. | 423/328.2 |
| 6,607,594 | B2 * | 8/2003 | Fujiwara et al. | 117/32 |
| 6,632,280 | B2 * | 10/2003 | Hoshi et al. | 117/217 |

(Continued)

OTHER PUBLICATIONS

D. Hull et al., "Introduction to Dislocations: Jogs and the Intersection of Dislocations," 1984, pp. 129-144.

(Continued)

*Primary Examiner* — James McDonough
(74) *Attorney, Agent, or Firm* — Greer, Burns & Crain, Ltd.

(57) ABSTRACT

The present invention reports a defect that has not been reported, and discloses a defect-controlled silicon ingot, a defect-controlled wafer, and a process and apparatus for manufacturing the same. The new defect is a crystal defect generated when a screw dislocation caused by a HMCZ (Horizontal Magnetic Czochralski) method applying a strong horizontal magnetic field develops into a jogged screw dislocation and propagates to form a cross slip during thermal process wherein a crystal is cooled. The present invention changes the shape and structure of an upper heat shield structure arranged between a heater and an ingot above a silicon melt, and controls initial conditions or operation conditions of a silicon single crystalline ingot growth process to reduce a screw dislocation caused by a strong horizontal magnetic field and prevent the screw dislocation from propagating into a cross slip.

9 Claims, 20 Drawing Sheets

U.S. PATENT DOCUMENTS

| | | | | |
|---|---|---|---|---|
| 6,899,758 B2 * | 5/2005 | Abe et al. | | 117/13 |
| 8,114,215 B2 * | 2/2012 | Song et al. | | 117/32 |
| 2009/0183670 A1 * | 7/2009 | Cho et al. | | 117/32 |
| 2010/0288185 A1 * | 11/2010 | Filar | | 117/13 |

OTHER PUBLICATIONS

Oleg Weinstein et al., "Estimation of surface energy effects in partially faceted melt/crystal interfaces during directional growth of single crystals from their melt," 2007, pp. 480-490.

S.H. Davis, "Theory of Solidification: Pure Substances," 2001, pp. 7-41.

W.A. Tiller, "The Science of Crystallization Macroscopic Phenomena and Defect Generation: Convection and heat transfer," 1991, pp. 42-59.

Stanislaw Mrowec, "Defects and Diffusion in Solids and Introduction" 1980, pp. 23-37.

* cited by examiner

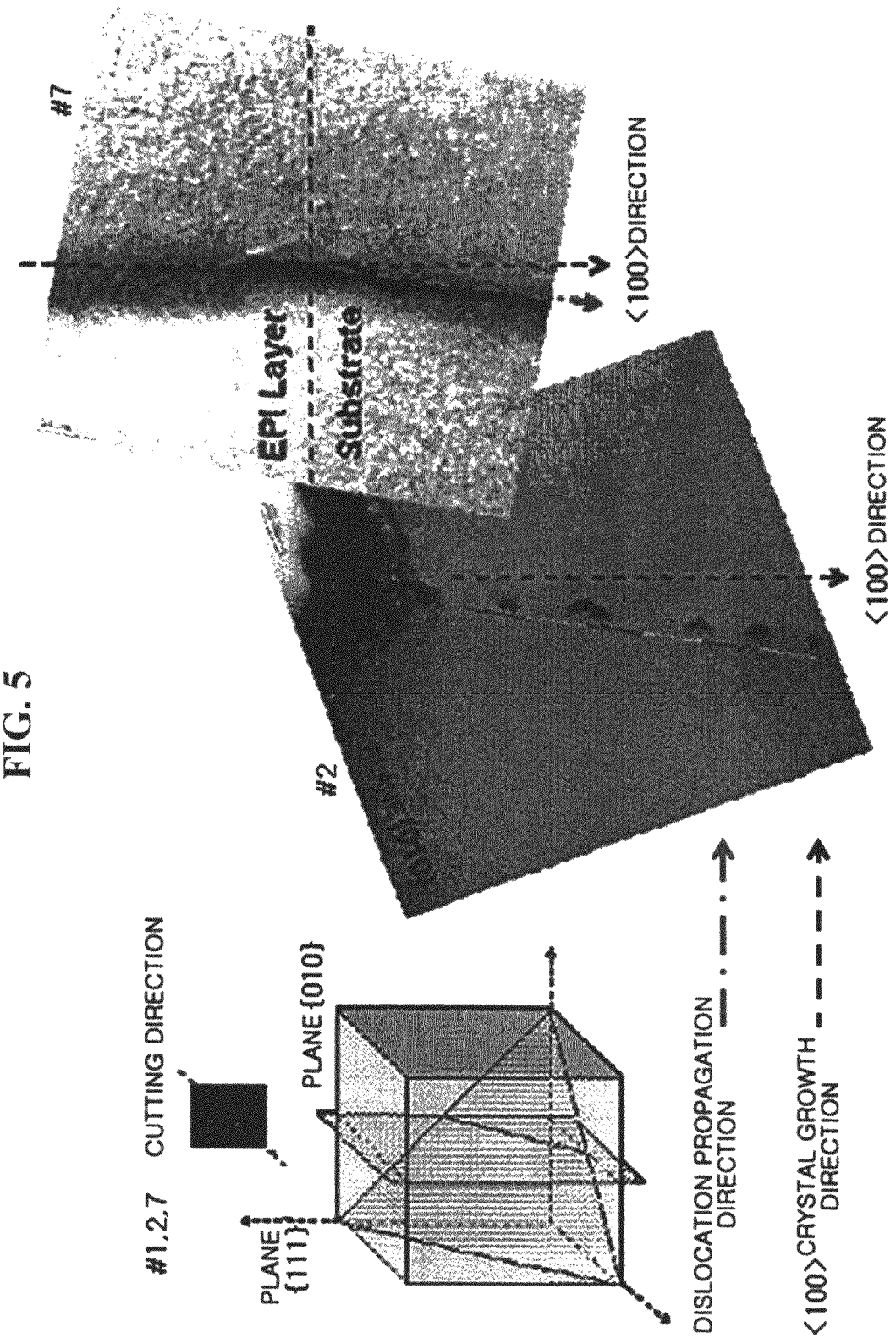

FIG. 14
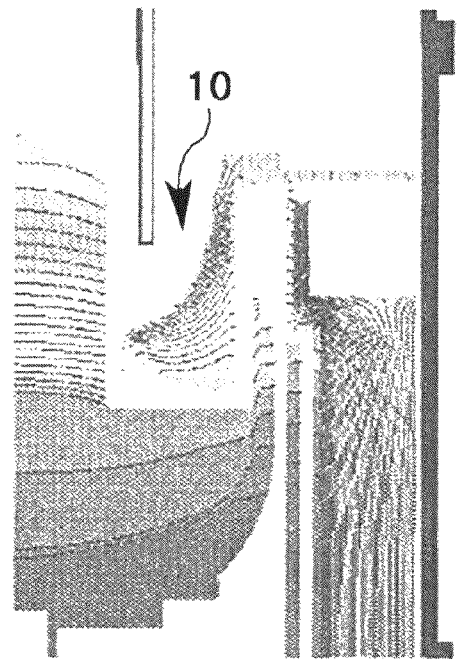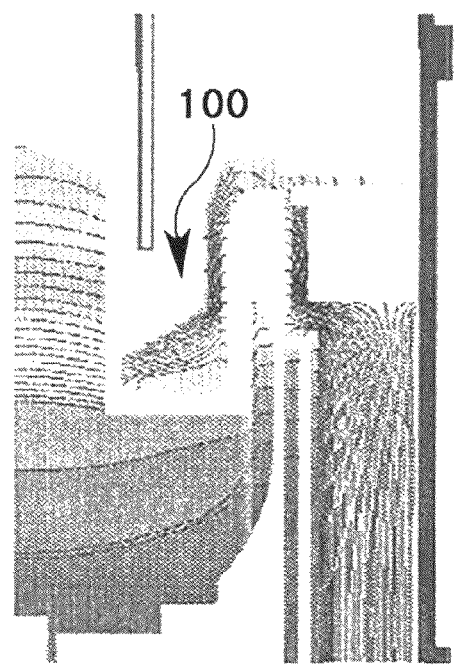
(a) COMPARATIVE EXAMPLE P/S 0.7 Target
(b) EXAMPLES 1,2,3 P/S 0.6/0.7/0.8 Target FIG. 17
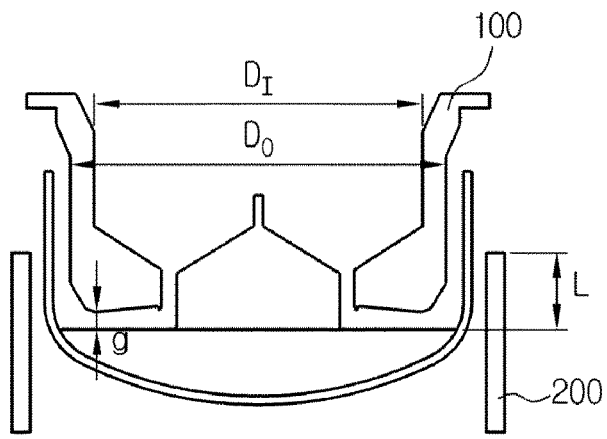
(a)
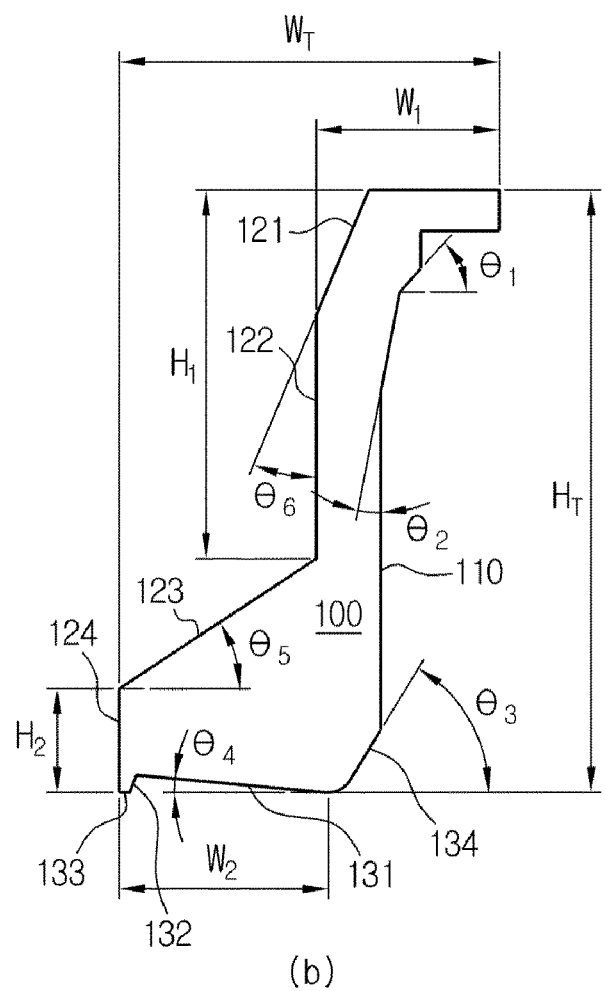
(b)

2-DIMENSIONAL LINE-DEFECTS CONTROLLED SILICON INGOT, WAFER AND EPITAXIAL WAFER, AND MANUFACTURING PROCESS AND APPARATUS THEREFOR

This is a divisional of application Ser. No. 12/256,663, filed Oct. 23, 2008.

FIELD OF THE INVENTION

The present invention relates to a silicon ingot, a wafer and an epitaxial wafer, and a process and apparatus for manufacturing the same, and in particular, to a technique for controlling and reducing crystal defects.

BACKGROUND OF THE INVENTION

In general, silicon wafers are fabricated through a process for growing a silicon single crystalline ingot, a process for slicing the ingot into disc-type wafers and a process for polishing the wafer surface, and the resultant silicon wafers are provided to manufacture semiconductor devices. However, in the process for growing a silicon single crystalline ingot, crystal defects caused by crystal growing and undesired impurities that are not caused by crystal growing may be included in a silicon single crystalline ingot and a wafer. Such crystal defects or impurities cause faults to a semiconductor device, and thus they should be removed.

FIG. 1 is a view showing crystal defects reported so far. In FIG. 1, small circles are silicon atoms.

As shown in FIG. 1, various types of crystal defects may be included in a silicon single crystalline ingot or a wafer, and the crystal defects may be classified into a point defect, a line defect, a plane defect and a volume defect according to how they exist in a crystal.

The point defect may include an intrinsic point defect and an extrinsic point defect. The intrinsic point defect includes a vacancy ((a) in FIG. 1) and a self-interstitial atom ((b) in FIG. 1). The extrinsic point defect includes a substitutional impurity atom ((c) in FIG. 1), an interstitial impurity atom ((d) in FIG. 1) and a dangling bond ((e) in FIG. 1). The line defect includes an edge dislocation ((f) in FIG. 1) and a screw dislocation (not shown in FIG. 1). The plane defect includes an interstitial stacking fault ((g) in FIG. 1), a vacancy-type stacking fault ((g) in FIG. 1), a twin (not shown in FIG. 1) and a grain boundary (not shown in FIG. 1). And, the volume defect includes a precipitate ((i) in FIG. 1) and a void ((j) in FIG. 1).

Meanwhile, these crystal defects range from atomic level to molecular level, and their crystallographic structures are difficult to recognize and detect. And, considering impurities not caused by crystal growing, it is more difficult to recognize and detect defects or impurities on or in a wafer. Further, new defects or impurities are discovered and named according to physical and chemical characteristics of their crystallographic structures and development of detection systems. According to this criteria, defects can be classified as shown in Table 1.

TABLE 1

| Detection technique | Vacancy-type defect | | | Interstitial-type defect | | | Reference |
|---|---|---|---|---|---|---|---|
| | Volume defect | Plane defect | Point defect | Point defect | Plane defect | Volume defect | |
| Etching, Visible ray | COP FPD SEPD LSTD | | | | | LDP EPD SEPD | |
| Heating, Etching, Visible ray | | P-band (OiSF) | | | B-band | | |
| Heating, Electrical measurement | V-cluster | P-band | $P_V$ | $P_I$ | B-band | I-cluster | Metal impurities |
| Hand | Air pocket | | | | | | |

COP: Crystal Originated Particle
FPD: Flow Pattern Defect
SEPD: Secco Etch Pit Defect
LSTD: Laser Scattering Tomography Defect
LDP: Large Dislocation Pit
EPD: Etch Pit Dislocation And, newly discovered defects are generally detected when a completed wafer is inspected or a semiconductor device is formed on a wafer and inspected. In particular, as a wafer moves toward larger diameter and a required quality level becomes higher, defects that were not regarded as a problem or detected in the past are regarded as a problem or discovered. If such defects have not been reported so far, they are named and reported through extremely difficult study and analysis of their cause and generation mechanism.

SUMMARY OF THE INVENTION

The inventors of the present invention discovered defects that have not been reported so far, analyzed their generation mechanism and developed a technique for reducing the defects, which is a subject of the present invention.

Therefore, it is an object of the present invention to provide a silicon single crystalline ingot, a silicon wafer, a silicon epitaxial wafer, and a process and apparatus for manufacturing the same that reduce newly discovered crystal defects by analyzing their generation mechanism.

The inventors of the present invention found that newly discovered crystal defects in a silicon single crystal are generated when a screw dislocation caused by a HMCZ (Horizontal Magnetic Czochralski) method using a strong horizontal magnetic field develops into a jogged screw dislocation and propagates to form a cross slip during thermal process wherein a crystal is cooled (detailed description is herein made later). And, they named the newly discovered crystal defects in a silicon single crystal as a cross slip dislocation (CSD). To reduce the CSD, the present invention provides an apparatus for manufacturing a single crystalline ingot as described below. That is, according to an aspect of the present invention, an apparatus for manufacturing a silicon single crystalline ingot manufactures a silicon single crystalline ingot by a HMCZ method, and the apparatus includes an upper heat shield structure that is spaced apart with a predetermined gap from a surface of a silicon melt contained in a crucible and arranged around a silicon single crystalline ingot pulled from the silicon melt and has a cross section taken in the lengthwise direction of the ingot, the cross section including an outer wall extending vertically or slantly relative to the surface of the silicon melt; an inner wall having an inner slant surface facing the ingot opposite to the outer wall and approaching to the ingot downwards, and an inner vertical surface extending substantially vertically downwards from a lower end of the inner slant surface; and a lower surface having a lower slant surface extending towards the inner wall from a lower end of the outer wall and going away from the surface of the silicon melt at a first angle relative to the surface of the silicon melt, a lower downward surface extending downwards from an end of the lower slant surface at the side of the inner wall, and a lower horizontal surface extending substantially horizontally towards the inner vertical surface from a lower end of the lower downward surface and meeting the inner vertical surface, wherein the first angle is 2° to 8°, so that a screw dislocation which may be generated in the silicon single crystalline ingot due to the HMCZ method is controlled.

Here, a portion where the outer wall meets the lower slant surface may be rounded or chamfered. In this case, preferably a second angle between the chamfered portion and the surface of the silicon melt is 49° to 74°.

And, the inner slant surface may include a first slant surface extending substantially vertically downwards from an upper surface of the upper heat shield structure, and a second slant surface extending slantly towards the inner vertical surface from a lower end of the first slant surface.

According to another aspect of the present invention, a process for manufacturing a silicon single crystalline ingot manufactures a silicon single crystalline ingot using the above-mentioned manufacturing apparatus, and the process includes providing the above-mentioned apparatus; preparing a silicon melt by putting silicon solid raw material in the crucible of the apparatus and heating the silicon solid raw material using a heater arranged around the crucible to melt the silicon solid raw material; and applying a horizontal magnetic field to the silicon melt received in the crucible and pulling up a silicon single crystalline ingot from the silicon melt using a silicon single crystalline seed, whereby the process controls a screw dislocation that may be generated in the silicon single crystalline ingot due to a HMCZ method.

At this time, the present invention controls process conditions as follows to obtain a silicon single crystalline ingot, a wafer and an epitaxial wafer that are substantially free of a screw dislocation.

That is, preferably a gap between the upper heat shield structure and a surface of the silicon melt is maintained between 20 mm and 50 mm while the silicon single crystalline ingot is pulled up.

Preferably, a height from the surface of the silicon melt to a top of the heater arranged around the crucible is maintained between 100 mm and 150 mm while the silicon single crystalline ingot is pulled up.

Preferably, the crucible is rotated at a speed between 0.01 rpm and 1.0 rpm, and the ingot is rotated at a speed between 5.0 rpm and 10.0 rpm in the direction opposite to a rotation direction of the crucible while the silicon single crystalline ingot is pulled up. At this time, preferably a ratio of the ingot rotation speed to the crucible rotation speed is between 5 and 50.

Preferably, the horizontal magnetic field is applied to the silicon melt with an intensity between 1000 Gauss and 4000 Gauss while the silicon single crystalline ingot is pulled up.

And, the present invention may add carbon, nitrogen or oxygen as an impurity to the silicon melt to prevent propagation of a screw dislocation that may be generated in the silicon single crystalline ingot due to a HMCZ method. At this time, carbon, nitrogen or oxygen is added with a concentration of 5E14~2E16, 5E13~3E14 or 1E17~1E18 atoms/cc, respectively.

Preferably, a pulling speed of the silicon single crystalline ingot is maintained between 0.5 mm/min and 1.0 mm/min.

According to yet another aspect of the present invention, a silicon single crystalline ingot is manufactured using the above-mentioned manufacturing apparatus, and thus is substantially free of a cross slip dislocation caused by a screw dislocation resulted from a HMCZ method.

And, a silicon wafer according to the present invention is manufactured by slicing a silicon single crystalline ingot that is substantially free of a cross slip dislocation, and thus is substantially free of a cross slip dislocation caused by a screw dislocation resulted from a HMCZ method.

Further, a silicon epitaxial wafer according to the present invention is manufactured by growing a silicon epitaxial layer on a silicon wafer that is substantially free of a cross slip dislocation, and thus is substantially free of a cross slip dislocation caused by a screw dislocation resulted from a HMCZ method.

BRIEF DESCRIPTION OF THE DRAWINGS

FIG. 4 is a graph indicating locations of defects detected at the same spot of a plurality of wafers obtained from a silicon single crystalline ingot on a (z, r, θ) cylindrical coordinate system. Here, z is a central axis of the ingot, r is a radial distance from z-axis, and θ is a rotation angle based on z-axis in a plane perpendicular to z-axis.

FIG. 5 is a photograph showing an etched pit that is found on the SEM photograph of CSD, cut along {010} plane and observed by TEM (Transmission Electron Microscope).

FIG. 14(a) is a view showing simulation results of temperature gradients of a silicon single crystalline ingot and a melt using a conventional upper heat shield structure, and FIG. 14(b) is a view showing simulation results of temperature gradients of a silicon single crystalline ingot and a melt using an upper heat shield structure according to an embodiment of the present invention.

FIG. 17 is a cross-sectional view showing the upper heat shield structure of FIG. 14(b) in more detail together with each design variable and some process conditions of the upper heat shield structure.

FIG. 18(a) shows a CSD generation rate of a silicon wafer manufactured using a conventional upper heat shield structure and process conditions. FIG. 18(b) shows a CSD generation rate of a silicon wafer manufactured using the upper heat shield structure of FIG. 14(b) and conventional process conditions. FIG. 18(c) shows a CSD generation rate of a silicon wafer manufactured using the upper heat shield structure of FIG. 14(b) and process conditions of Table 3.

DETAILED DESCRIPTION OF THE INVENTION

Hereinafter, new defects in a silicon single crystal discovered by the inventors of the present invention and the present invention for reducing the defects will be described in detail with reference to the accompanying drawings.

Prior to the description, it should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation. Therefore, the description proposed herein is just a preferable example for the purpose of illustrations only, not intended to limit the scope of the invention, so it should be understood that other equivalents and modifications could be made thereto without departing from the spirit and scope of the invention.

First, defects in a silicon single crystal discovered newly by the inventors of the present invention are described.

Figure 1:
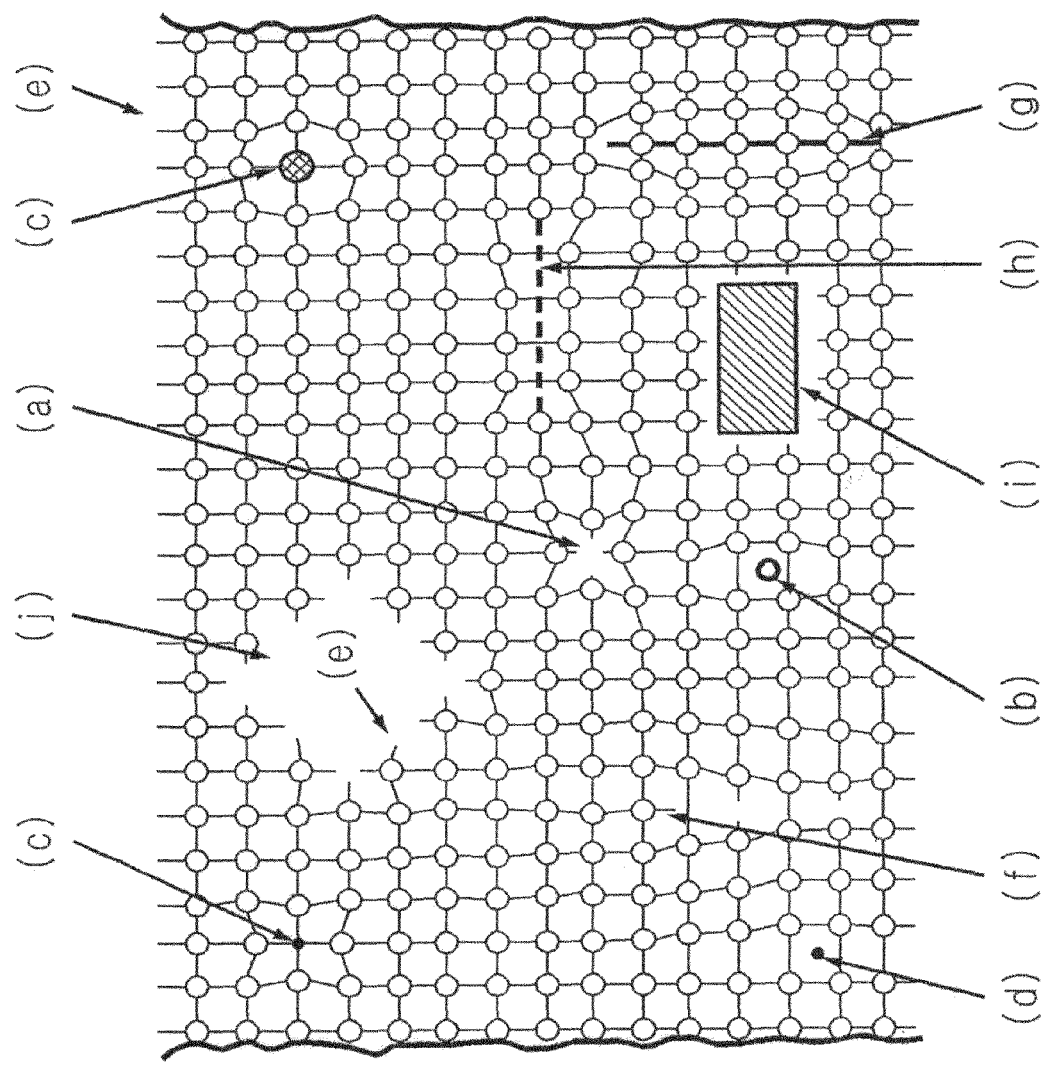
FIG. 1 is a view showing diagrammatically general crystal defects.
Figure 2A:
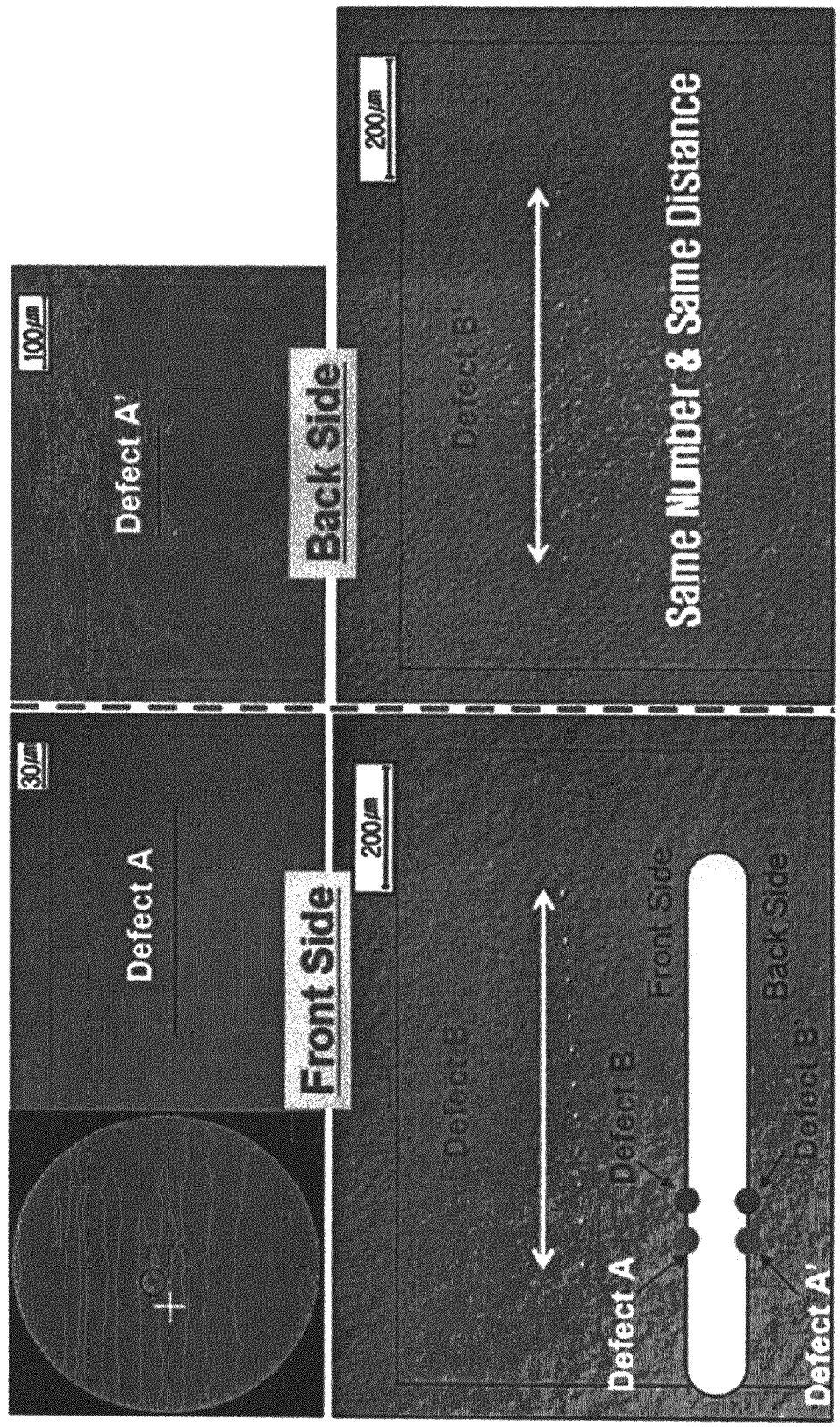
FIG. 2 is a photograph showing a cross slip dislocation (CSD), i.e. a crystal defect on a silicon wafer discovered by the inventors of the present invention that is wright-etched for five minutes and observed by SEM (Scanning Electron Microscope).
Figure 2B:
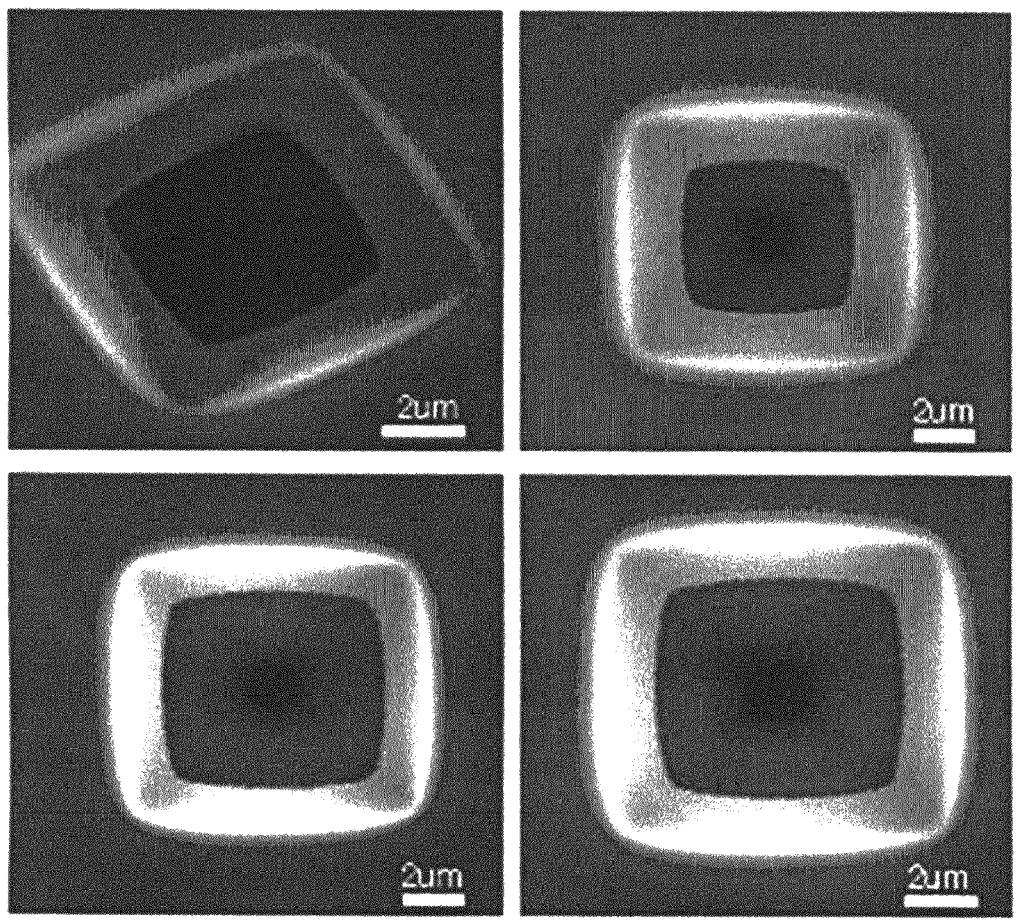

The inventors discovered that defects having a specific pattern were generated on a specific silicon epitaxial wafer. That is, particular defects were not detected on a silicon wafer before growth of a silicon epitaxial layer, however after a silicon epitaxial layer of 4 μm thickness is grown, a specific particle pattern was detected. Then, the wafer was etched using a Wright etchant for 5 minutes, and observed by a scanning electron microscope (SEM). As shown in FIG. 2, etched pits (see FIG. 2(b)) of rectangular shape were observed at a specific spot of the wafer. The wafer had the same distribution of the same number of etched pits on a front side and a back side thereof. This means that the etched pits are not defects of a single wafer level, but defects arranged continuously in the lengthwise direction of an ingot.

Figure 3:
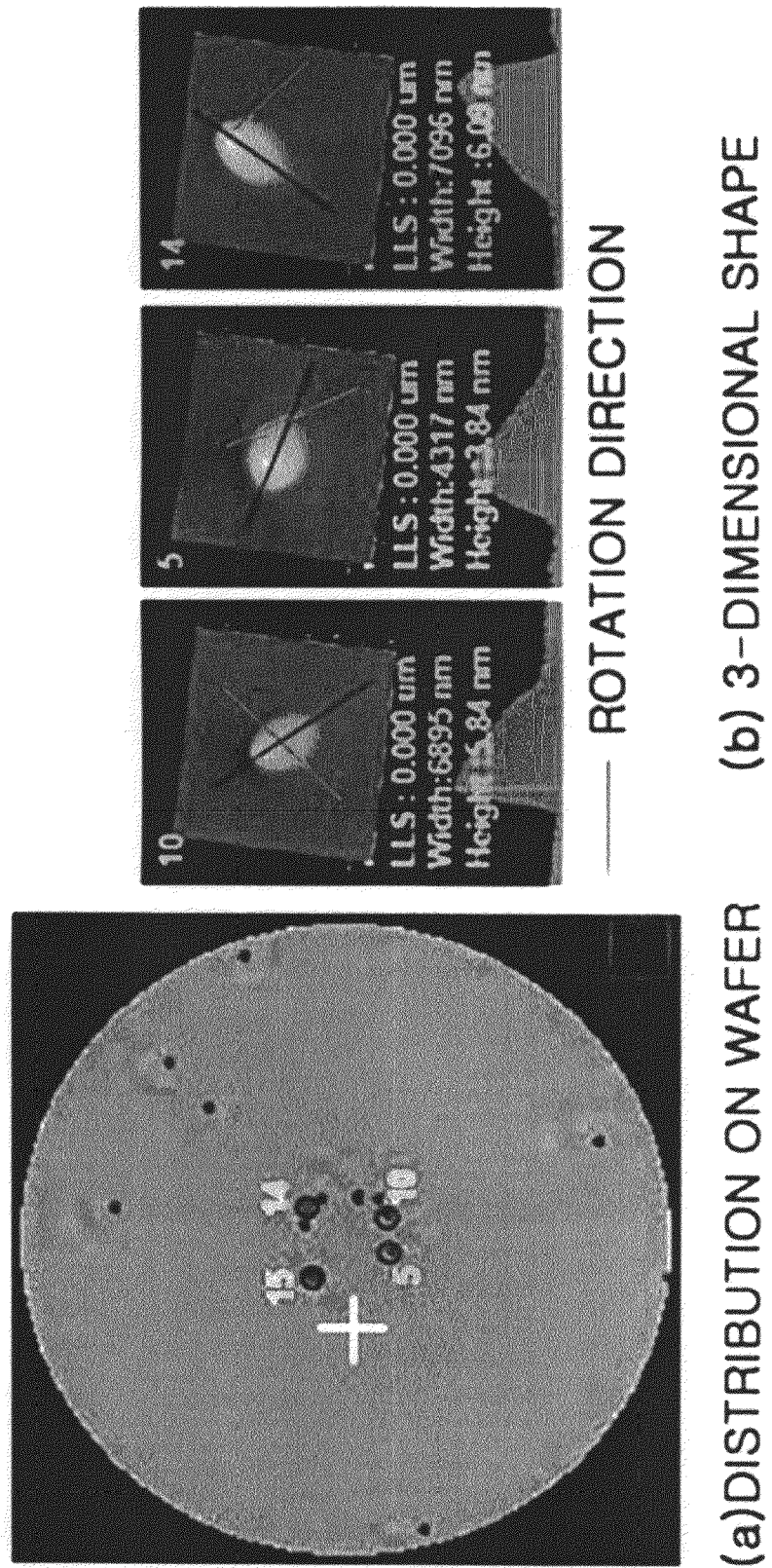
FIG. 3 is a photograph showing CSD that is observed by AFM (Atomic Force Microscope).
Figure 4A:
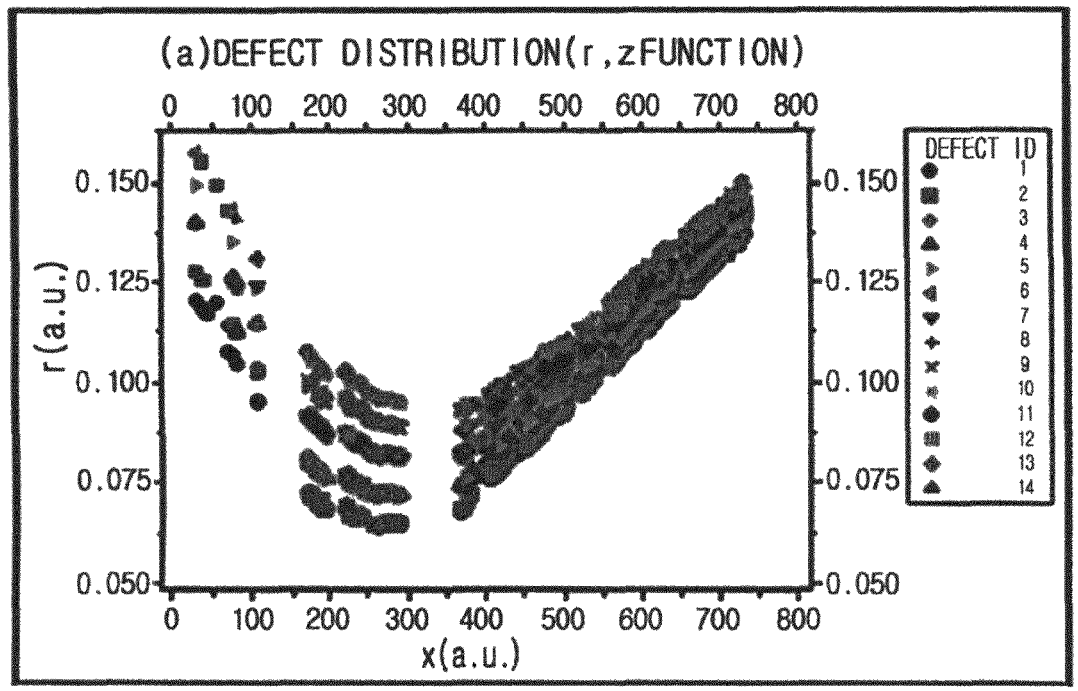
FIG. 4(a) shows a distribution of the defects as a (r, z) function.
Figure 4B:
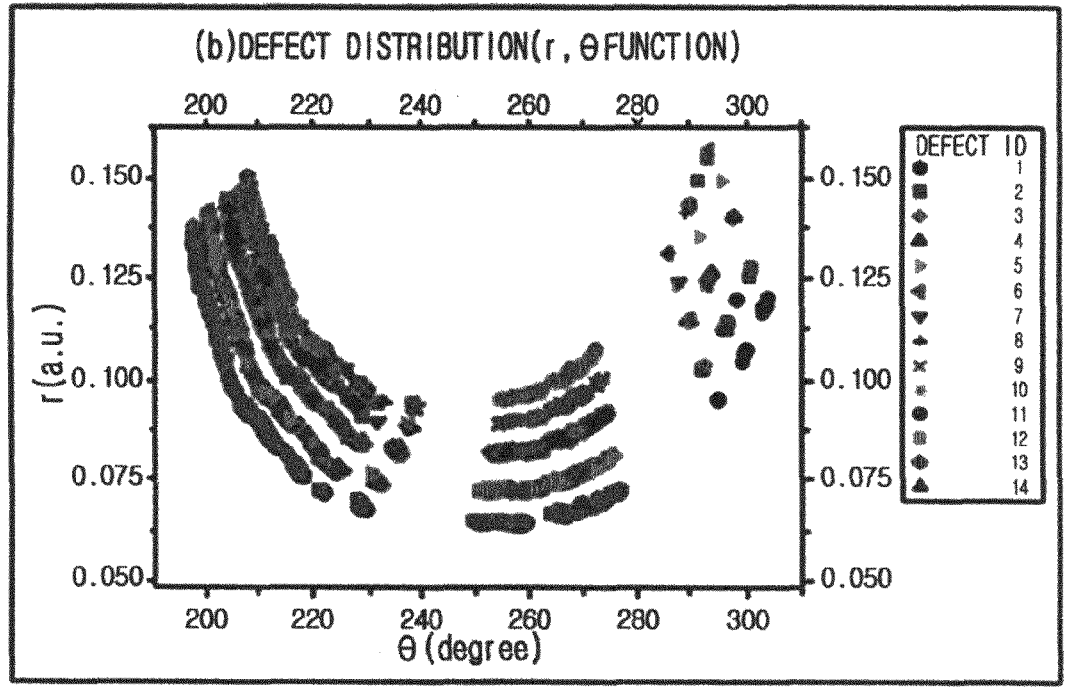
FIG. 4(b) shows a distribution of the defects as a (r, θ) function. And, 4(c) illustrates a result obtained by connecting locations of a defect distributed at the same spot of the wafers in the lengthwise of the ingot based on the results of FIG. 4(a) and FIG. 4(b).

Thus, the inventors sliced a silicon single crystalline ingot into silicon wafers; polished the silicon wafer surface, and observed the silicon wafers by an atomic force microscope (AFM). After observation, they obtained defect distribution and shape shown in FIG. 3. And, they displayed defects distributed at the same spot of a plurality of wafers on a cylindrical coordinate system wherein the lengthwise direction of the ingot is a z-axis, and defect distribution is shown in FIG. 4. FIG. 4(a) is a graph showing a change in distance of defects distributed at the same spot of a plurality of wafers from a central axis along the lengthwise direction of an ingot. FIG. 4(b) is a graph showing a change in distance of defects distributed at the same spot of a plurality of wafers from a central axis according to rotation angle θ. In FIGS. 3 and 4, numbers 1 to 15 are ones assigned to defects detected on a wafer. Meanwhile, FIG. 4(c) illustrates a result obtained by connecting locations of a defect distributed at the same spot of the wafers in the lengthwise direction of an ingot based on the results of FIG. 4(a) and FIG. 4(b). It was found through FIG. 4 that the distance of defects from a central axis decreased and then increased in the lengthwise direction of an ingot, and the defects rotated in a clockwise or counter-clockwise direction.

Subsequently, an etched pit identified on the SEM photograph was cut along plural crystallographic planes and observed by a Transmission Electron Microscope (TEM).

First, FIG. 5 is a TEM image of a silicon epitaxial layer that is grown on a defect-created silicon wafer and cut along {010} plane. In FIG. 5, a black square located at the upper left is an etched pit. It was found through FIG. 5 that a dislocation existed on a line where {111} plane meets {010} plane and appeared as a stacking fault type defect. It was also found that orientation of a dislocation on a substrate (wafer) is different from orientation of a dislocation on an epitaxial layer, and the generated dislocation is caused by the substrate.

Figure 6:
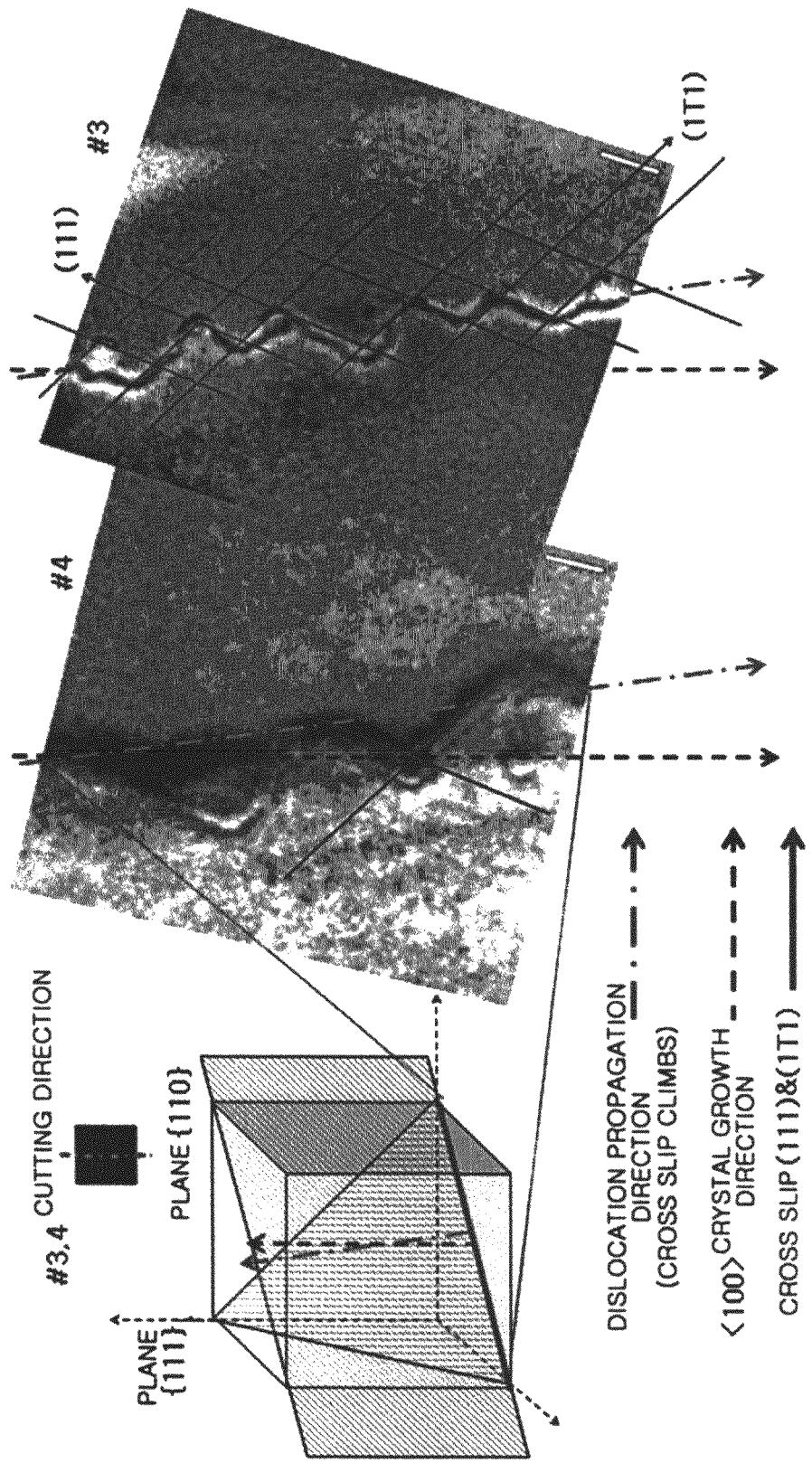
FIG. 6 is a photograph showing the etched pit that is found on the SEM photograph of CSD, cut along {110} plane and observed by TEM.
Figure 7:
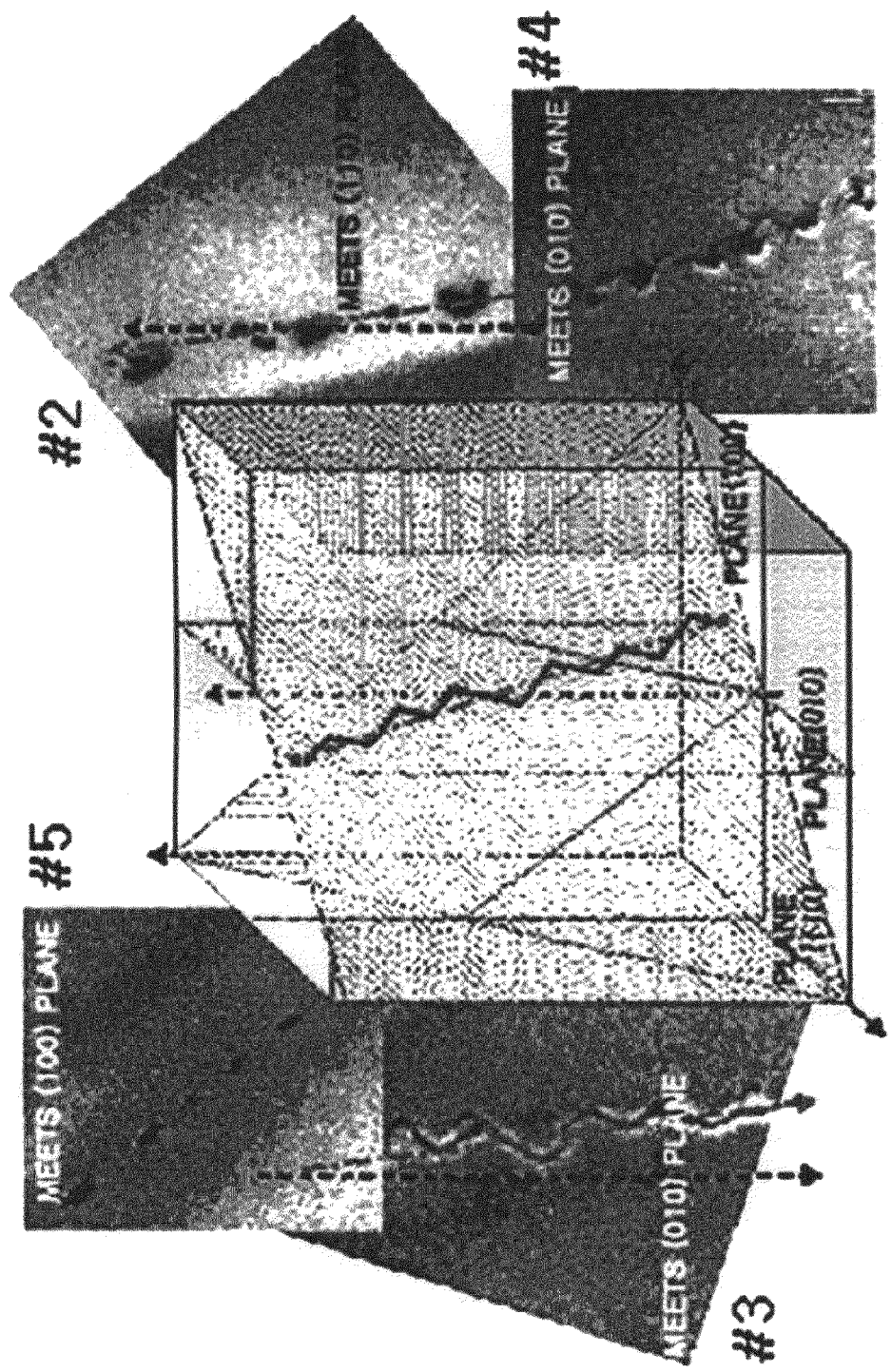
FIG. 7 is a photograph showing the etched pit that is found on the SEM photograph of CSD, cut along plural crystallographic planes and observed by TEM.
Figure 8:
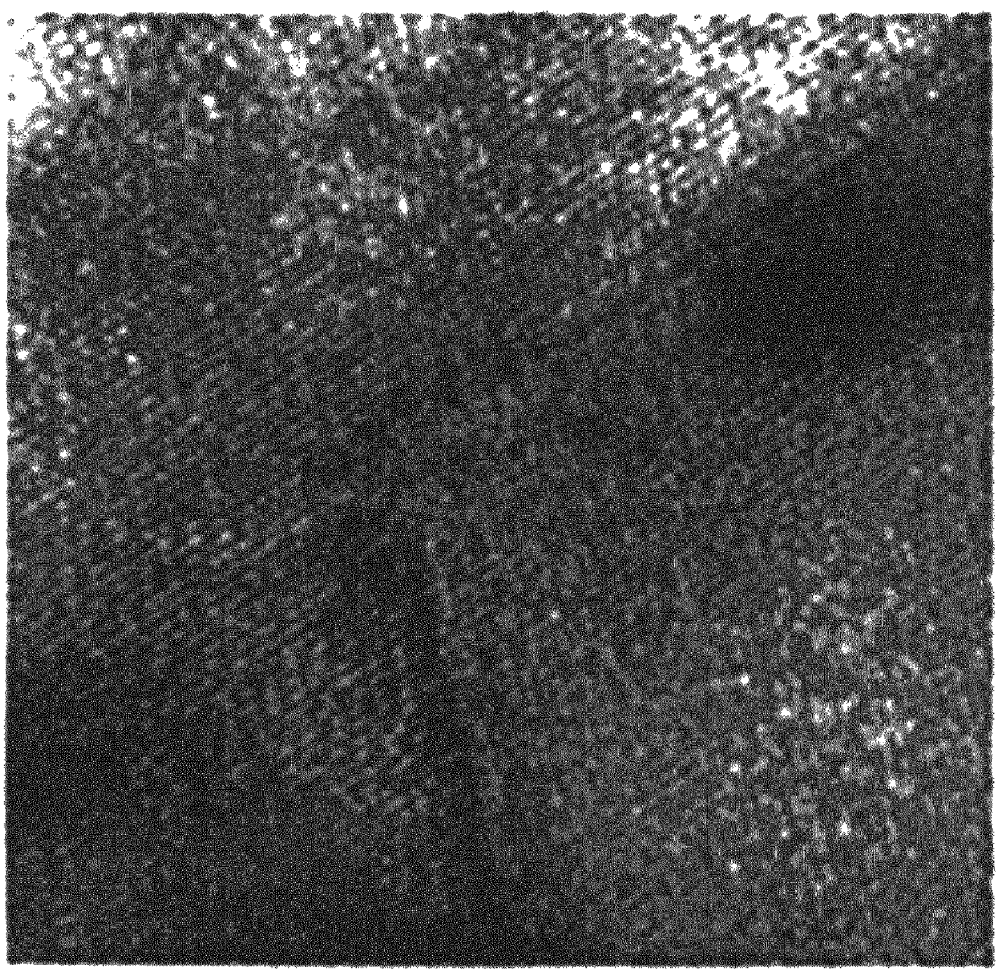
FIG. 8 is a photograph showing a cross slip of FIGS. 6 and 7 that is observed by a high resolution TEM.

And, FIG. 6 is a TEM image of the same wafer as that of FIG. 5 that is cut along {110} plane. In FIG. 6, a black square located at the upper left is an etched pit. As shown in FIG. 6, a cross slip of (111) plane and (1$\bar{1}$1) plane was observed on a line where {111} plane meets {110} plane. Accordingly, it was found that a Burgers vector and a slip plane did not exist on the same plane, and the above-mentioned defect was a dislocation propagated in the lengthwise direction of an ingot when a jogged screw dislocation developed into and climbed to a cross slip of a sessile Frank partial dislocation. FIG. 7 is a TEM image of the above-mentioned defect that is cut along each crystallographic plane. FIG. 8 is a high resolution TEM Image of the cross slip.

Through the above-mentioned analysis, the inventors of the present invention found that a defect discovered newly in a silicon single crystal was generated when a screw dislocation created during crystal growth developed into a jogged screw dislocation and propagated to form a cross slip during thermal process wherein a crystal is cooled, due to a difference between three-dimensional line characteristics of the screw dislocation and three-dimensional arrangement of silicon. The inventors named the newly discovered defect as a cross slip dislocation, which is hereinafter called CSD for short.

Figure 9:
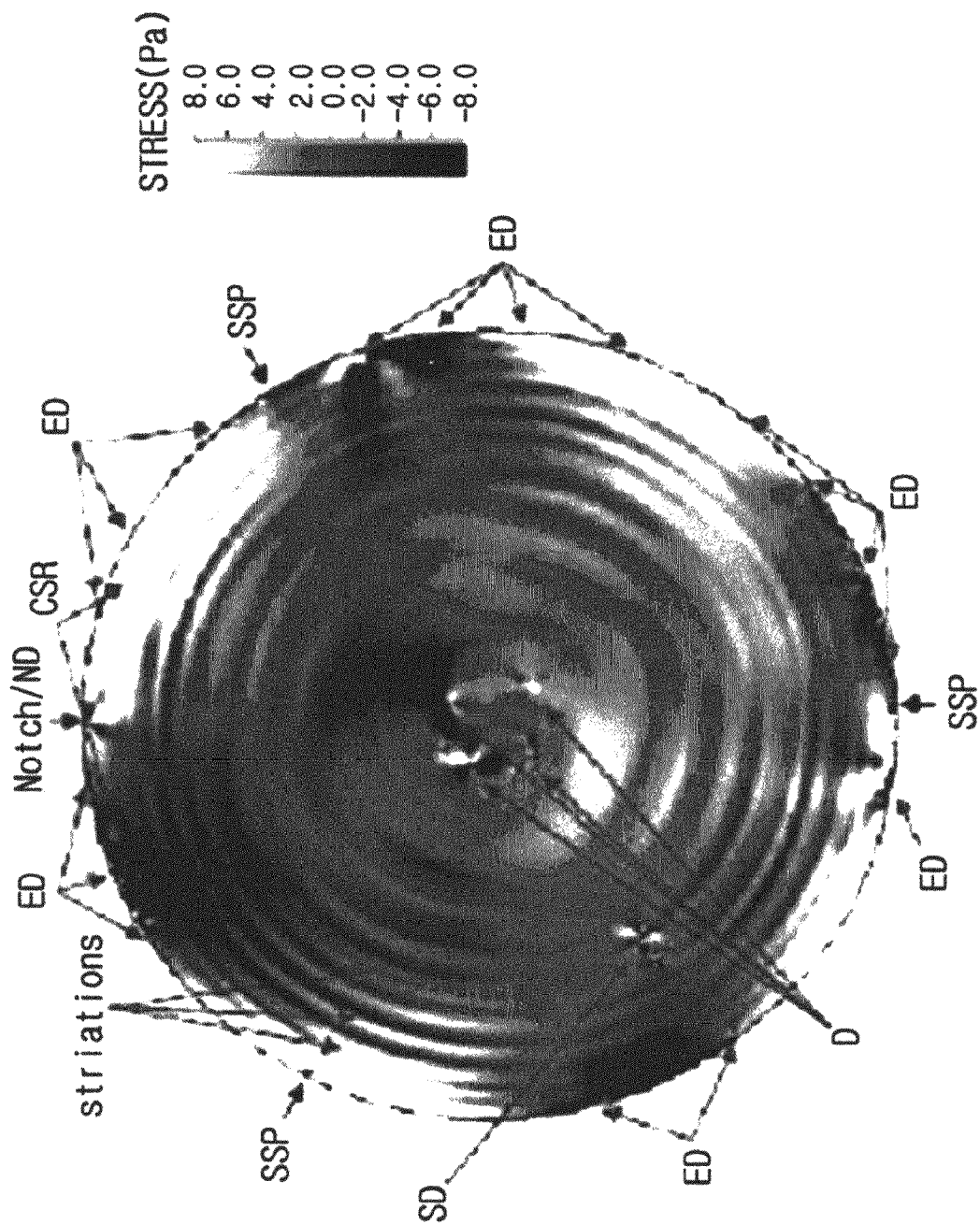
FIG. 9 is a photograph showing CSD that is detected by an SIRD (Scanning Infra Red Depolarization) method.

Meanwhile, the CSD could be detected through the above-mentioned process, but may be detected more conveniently and effectively using an SIRD (Scanning Infra Red Depolarization) method that irradiates/penetrates a polarized infrared light on/into a wafer and detects a change in polarization characteristics at a defect. FIG. 9 is a photograph of CSD detected by an SIRD method. In FIG. 9, 'D' is a spot where CSD was detected.

Figure 10:
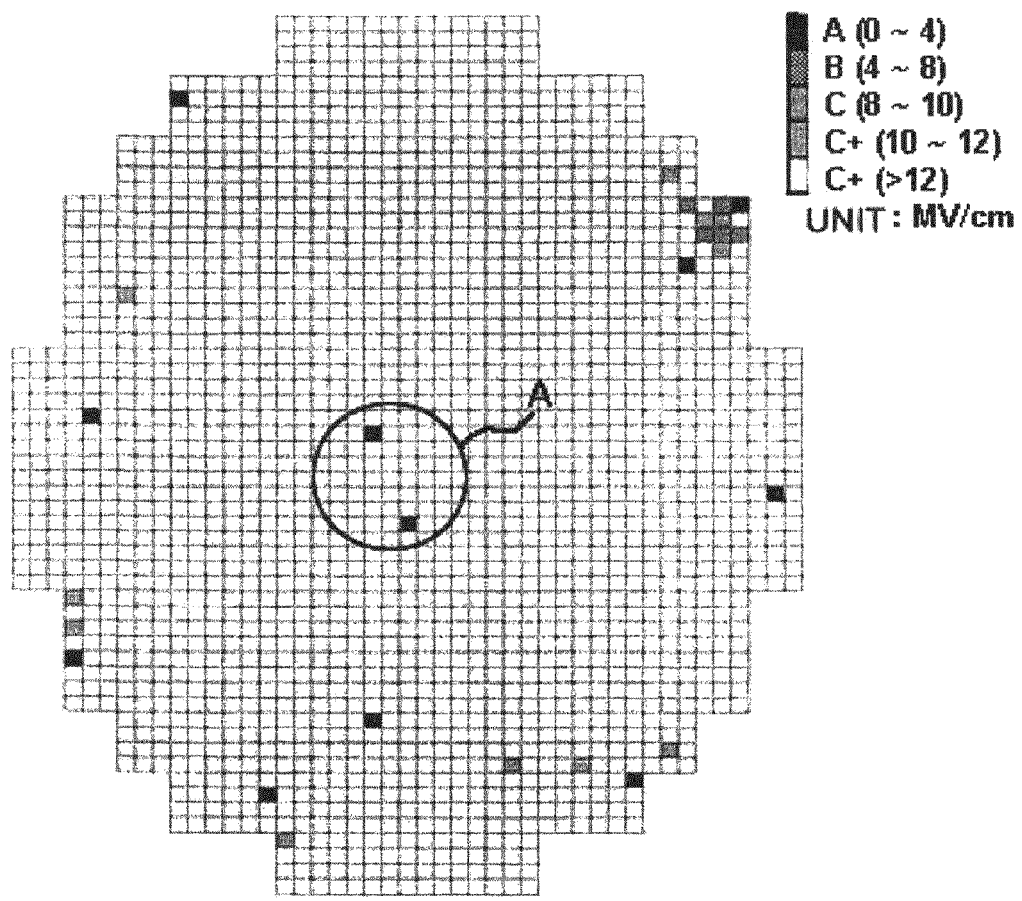
FIG. 10 is a map showing results of GOI (Gate Oxide Integrity) test on a wafer having CSD.

The inventors of the present invention evaluated the influence of CSD on a fault of a semiconductor device. For this purpose, a GOI (Gate Oxide Integrity) test was performed on a CSD-created wafer. As shown in FIG. 10, they found through the test results that B-mode fail caused by a crystal defect existing on a substrate (wafer) or A-mode fail caused by a defect existing on surface occurred to a device cell at a spot (A) where CSD exists. That is, they found that CSD influences directly a fault of a semiconductor device and should be removed or at least reduced.

Therefore, the inventors of the present invention sought to analyze a generation mechanism of CSD and devise a means for reducing the CSD.

First, as described above, CSD originates from a screw dislocation formed during crystal growth. It has not been reported that a screw dislocation was formed during silicon single crystal growth by a Czochralski method, however it has been known that a screw dislocation was formed during general crystal growth. For example, the following documents disclose a theoretical model about screw dislocation formation.

Document 1: Stanislaw Mrowec, "Defects and Diffusion in Solids and Introduction", Elsevier, 1980.

Document 2: D. Hull and D. J. Bacon, "Introduction to Dislocations", Pergamon, 1984.

Document 3: W. A. Tiller, "The Science of Crystallization: Macroscopic Phenomena and Defect Generation", Cambridge University, 1991.

Figure 11:
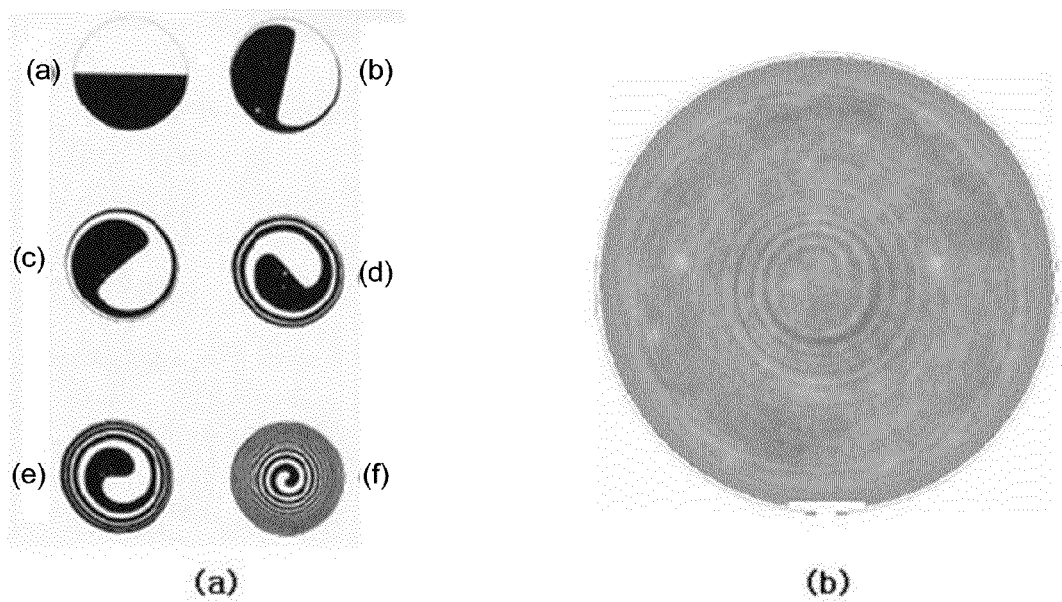
FIG. 11 is a view for description of a spiral shear distortion that is caused by seed rotation and crucible rotation in a HMCZ (Horizontal Magnetic Czochralski) method.

Meanwhile, as a silicon single crystalline wafer moves toward larger diameter recently, a HMCZ (Horizontal Magnetic Czochralski) method is widely used, which pulls up a silicon single crystalline ingot by a Czochralski method while applying a strong horizontal magnetic field around a crucible to control the convection of a silicon melt. However, due to application of a strong horizontal magnetic field, the HMCZ method has a disadvantage of immiscible fluid characteristics that a melt at the left side of an application direction of the magnetic field and a melt at the right side do not mix with each other well. On the other hand, an ingot grown from a single crystalline seed and a crucible each is rotated at a predetermined speed, and thus, a spiral shear distortion occurs to a silicon melt having immiscible fluid characteristics. FIG. 11(a) is a view illustrating conceptually a spiral shear distortion, and FIG. 11(b) is a mirror image of a spiral shear distortion occurred actually on a wafer.

Figure 12:
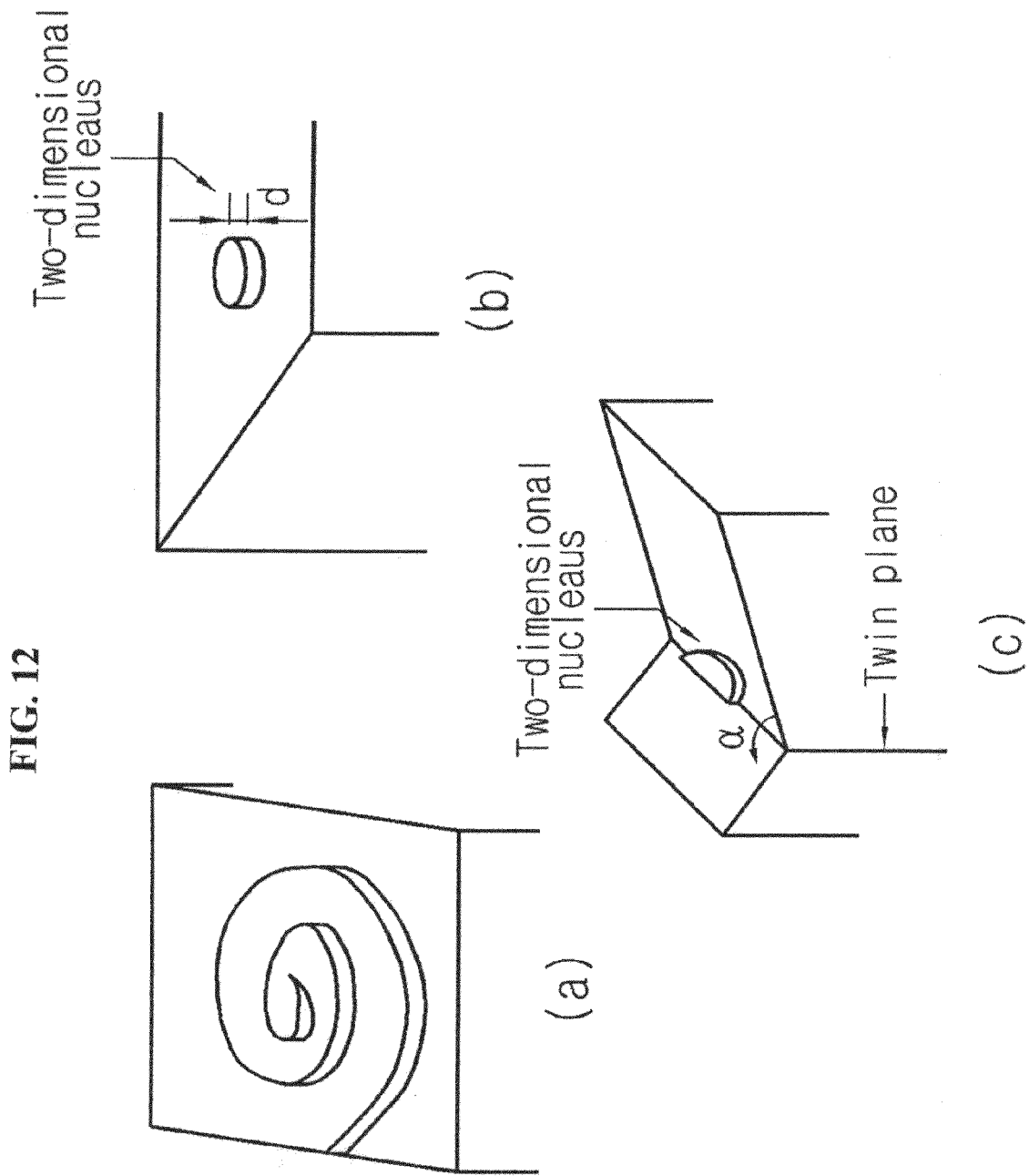
FIG. 12 is a view showing diagrammatically a plane growth mechanism of a crystal.

A growing mechanism of a crystal surface at an interface having a spiral shear distortion cannot avoid a screw dislocation from forming in the process as shown in FIG. 12(a) (for more information, see the following document).

Document 4: Oleg Weinstein et. al., "Estimation of surface energy effects in partially faceted melt/crystal interfaces during directional growth of single crystals from their melt", Journal of Crystal Growth 306 (2007), pp. 480-490.

Figure 13:
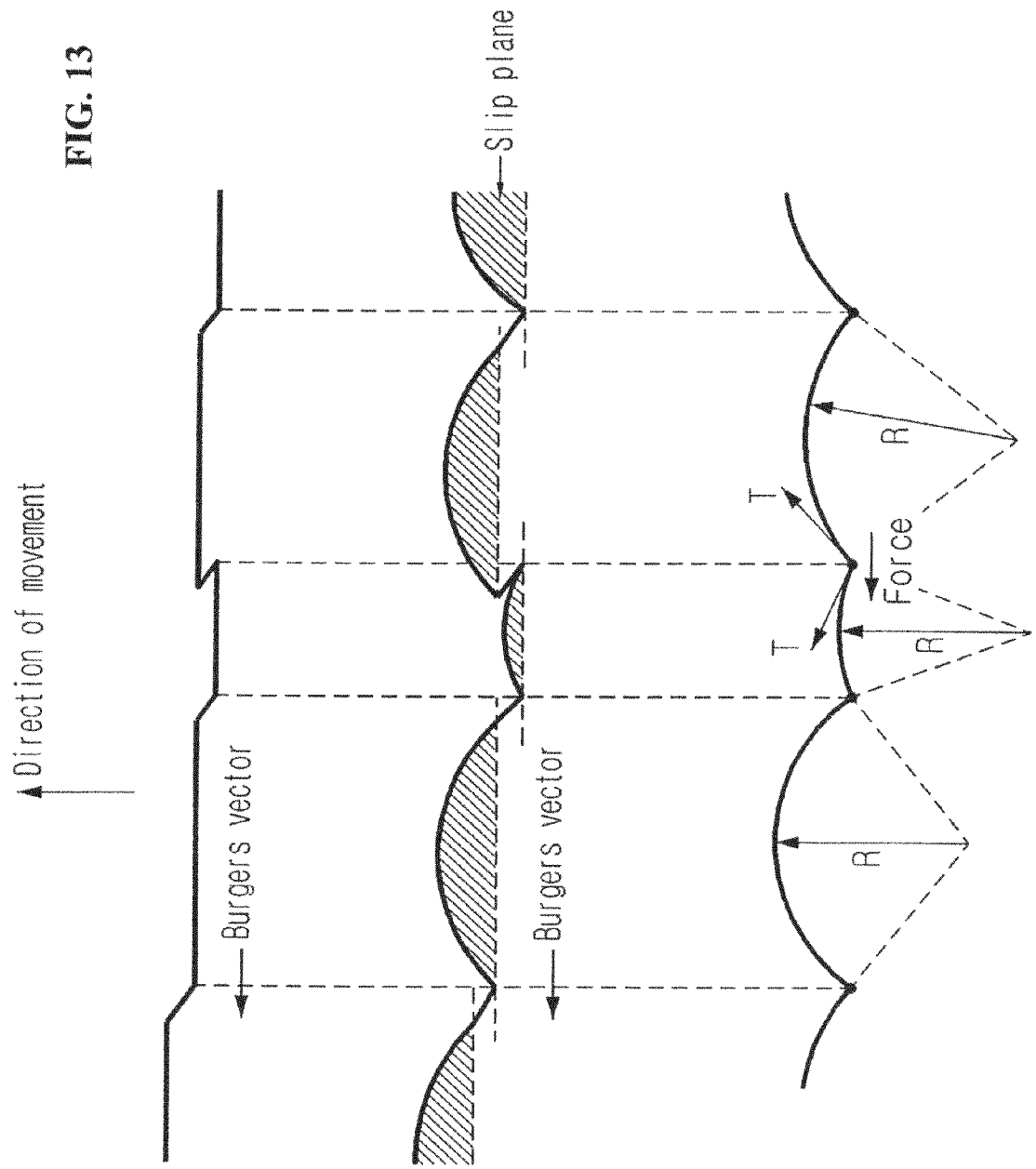
FIG. 13 is a view showing diagrammatically that a screw dislocation propagates to form a cross slip.

As mentioned above, due to a difference between three-dimensional line characteristics of a screw dislocation and three-dimensional arrangement of silicon, the screw dislocation develops into a jogged screw dislocation as shown in FIG. 13(a), and propagates to form a cross slip during thermal process wherein a crystal is cooled, as shown in FIG. 13(b) and (c) (for more information, see the above-mentioned document 2).

That is, CSD is created in a silicon single crystal because a crystal surface is formed under the conditions of a strong horizontal magnetic field applied by a HMCZ method and a spiral shear distortion caused by rotation of a seed and a crucible. To suppress generation of CSD in a silicon single crystal, growth of a line defect caused by a screw dislocation should be suppressed in a process for growing a silicon single crystalline ingot. The screw dislocation is caused by a change in fluid characteristics of a silicon melt due to a HMCZ method, and thus, to fundamentally suppress generation of CSD, it would be advantageous not to use a HMCZ method. However, as a silicon wafer moves toward larger diameter, inevitably a silicon melt moves toward larger quantity. To control the convection of a large quantity of silicon melt, it needs a HMCZ method. So, it requires a method for suppressing a screw dislocation using a HMCZ method.

Therefore, the inventors of the present invention found through the following experiment and the above-mentioned documents 2 and 5 that temperature of an interface where a silicon single crystal grows and growth speed, concentration of impurity including dopant and radius of curvature of the interface are important for CSD control.

Document 5: S. H. Davis, "Theory of Solidification", Cambridge University, 2001.

The above-mentioned factors related to CSD control can be represented by the following equation.

$$T^I = T_m\left(1 + 2H\frac{\gamma}{L_v}\right) + mC - \mu^{-1}V_n \qquad \text{Equation 1}$$

where $T^I$ is temperature at a melting point of the interface, $T_m$ is temperature at a melting point of silicon, $H$ is radius of curvature of the interface, $\gamma$ is surface energy, $L_v$ is freezing latent heat, $C$ is dopant concentration, $V_n$ is growth speed of a crystal, and m and μ are proportional constants.

Hereinafter, the present invention is described in detail through various experiments with regard to improvement in an apparatus for growing a silicon single crystalline ingot, initial conditions and operation conditions of a process for growing a silicon single crystalline ingot, and a method for preventing a screw dislocation from propagating during cooling of a silicon single crystalline ingot in order to control each factor in the above-mentioned equation.

First, a structure of an upper heat shield structure installed above a silicon melt was improved to control a factor H in the above-mentioned equation.

Originally, the upper heat shield structure is an element for shielding heat emitted from a heater installed around a crucible and a silicon melt from transmitting to an ingot, in particular, to the vicinity of an interface to control a temperature gradient near the interface and height of the interface, i.e. radius of curvature and control a cooling speed of an ingot.

FIG. 14(a) is a view illustrating simulation results of temperature gradients of an ingot and a melt when growing the ingot using a conventional upper heat shield structure 10, and FIG. 14(b) is a view illustrating simulation results of temperature gradients of an ingot and a melt when growing the ingot using an upper heat shield structure 100 according to an embodiment of the present invention. There is no significant difference in basic shape and structure between the conventional upper heat shield structure 10 and the upper heat shield structure 100 according to the present invention shown in FIGS. 14(a) and (b), respectively, however even a minute change of an upper heat shield structure considerably influences on defect characteristics of a grown ingot, which is verified through the following experimental example. Although a specific shape and structure of the upper heat shield structure 100 according to an embodiment of the present invention will be described later, the upper heat shield structure 100 is mainly different from the conventional upper heat shield structure 10 in a shape of its lower structure facing a silicon melt. Meanwhile, in FIG. 14, 'P/S' is a pulling speed of a silicon single crystalline ingot. A pulling speed was set to 0.7 mm/min in a comparative example using the conventional upper heat shield structure 10, and a pulling speed was set to 0.6 mm/min, 0.7 mm/min and 0.8 mm/min in examples 1, 2 and 3 using the upper heat shield structure 100 according to an embodiment of the present invention, respectively.

Figure 15:
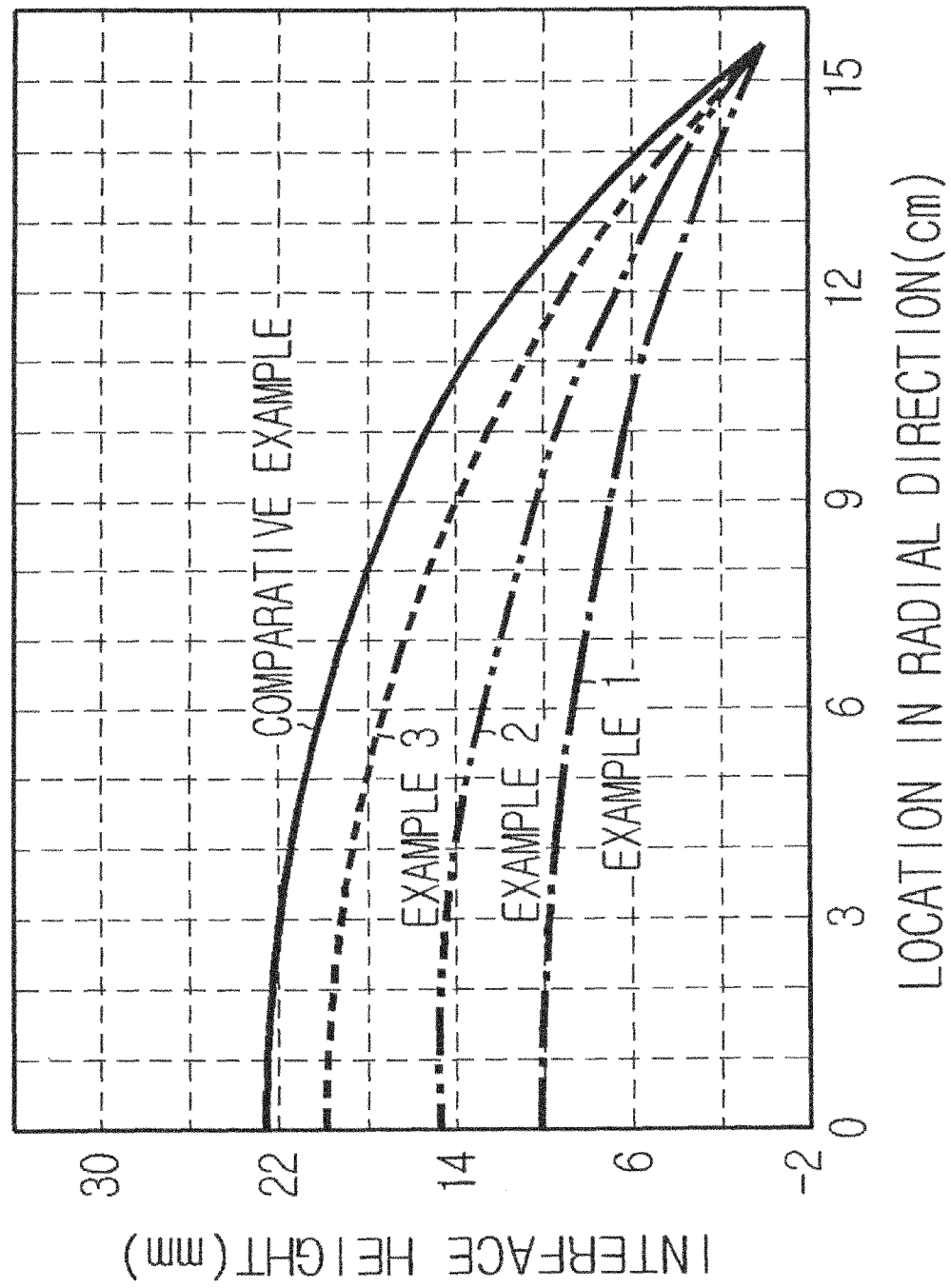
FIG. 15 is a graph showing height of an interface of a silicon single crystalline ingot formed according to simulation results of FIGS. 14(a) and (b).
Figure 16:
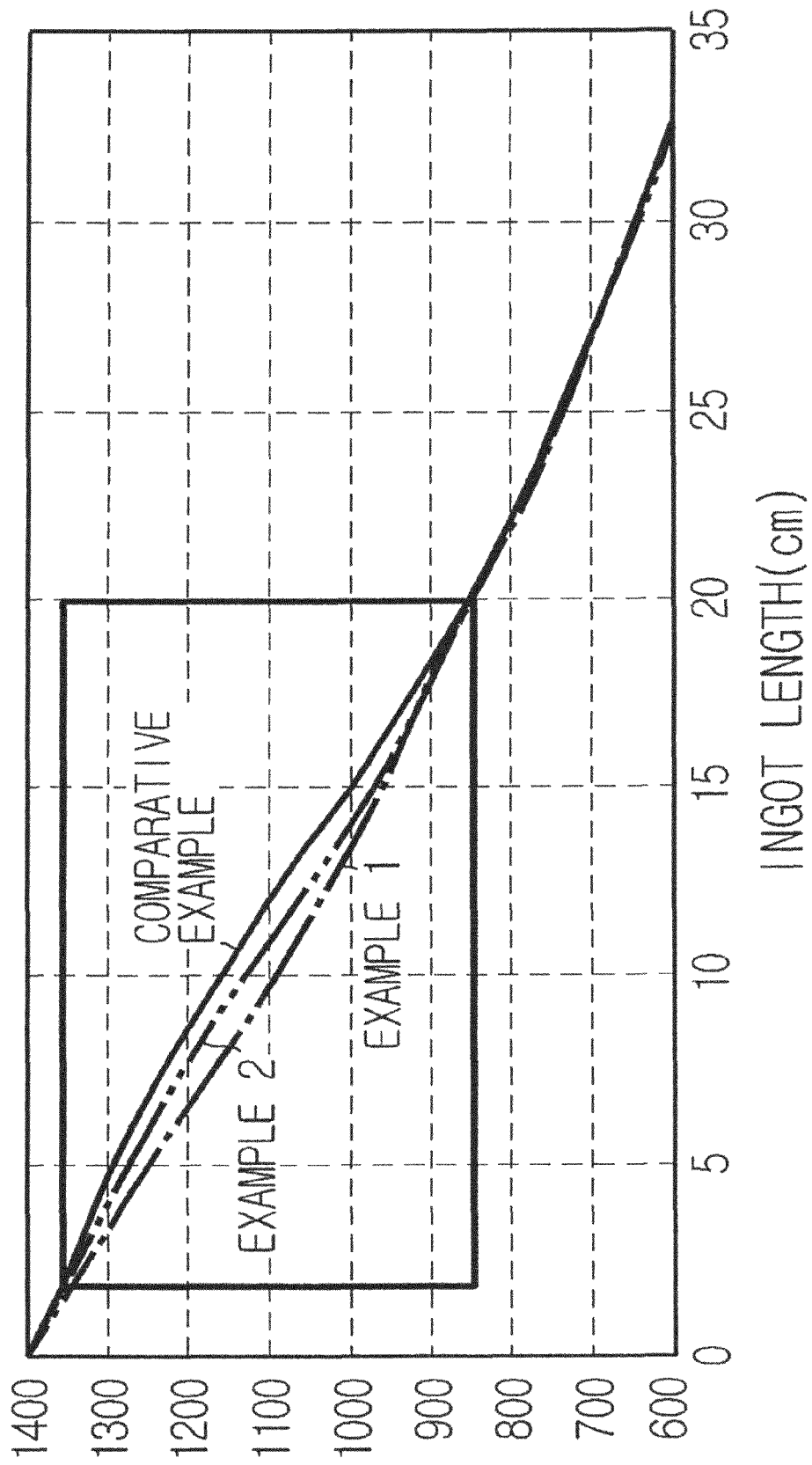
FIG. 16 is a graph showing a cooling speed depending on distance from an interface of a silicon single crystalline ingot according to simulation results of FIGS. 14(a) and (b).

FIG. 15 is a graph illustrating a height of an interface of a silicon single crystalline ingot formed according to simulation results. As shown in FIG. 15, all examples 1 to 3 using the upper heat shield structure 100 according to an embodiment of the present invention exhibited a lower height of an interface than the comparative example using the conventional upper heat shield structure 10. That is, a radius of curvature H of an interface of the examples of the present invention was larger than that of the comparative example. Therefore, as shown in FIG. 16 illustrating a cooling speed according to distance from an interface of a silicon single crystalline ingot, the examples of the present invention exhibited a faster cooling speed, i.e. a larger temperature gradient in the vicinity of the interface than the comparative example.

Meanwhile, all process conditions were set the same and silicon single crystalline ingots were grown using two types of upper heat shield structures shown in FIGS. 14(a) and (b), and then the ingots were sliced and polished to obtain wafers. CSD detection test was performed on the wafers as mentioned above. As a result, in the case of the conventional upper heat shield structure 10 shown in FIG. 14(a), CSD was detected in seven lots among twenty lots of ingots (see FIG. 18(a)). Meanwhile, in the case of the upper heat shield structure 100 according to an embodiment of the present invention shown in FIG. 14(b), CSD was detected in one lot among five lots of ingots (see FIG. 18(b)). It means that a change in shape and structure of an upper heat shield structure was remarkably effective for reduction of CSD. Accordingly, it was inferred that as shape and structure of an upper heat shield structure was changed, a radius of curvature H of an interface was changed, and consequently $\Delta T$ ($T_m - T^I$) determining a crystal surface growth mechanism was changed, so that a crystal was grown without formation of a screw dislocation.

The shape and structure of the upper heat shield structure 100 according to an embodiment of the present invention is described in detail with reference to FIG. 17.

In the same way as the conventional upper heat shield structure 10, the upper heat shield structure 100 according to an embodiment of the present invention is spaced apart with a predetermined gap from the surface of a silicon melt contained in a crucible and arranged in the shape of a ring around a silicon single crystalline ingot pulled from the silicon melt to shield heat emitted from a heater 200 and the silicon melt. And the upper heat shield structure 100 of this embodiment includes a peripheral portion made of graphite and defining a shape of the upper heat shield structure 100, and an insulating material filled in a space within the peripheral portion, such as a felt. The upper heat shield structure 100 of this embodiment is different from the conventional heat shield structure 10, in particular, in aspect of shape.

That is, the upper heat shield structure 100 of this embodiment has an upper surface, an outer wall 110, an inner wall 121 to 124 and a lower surface 131 to 134 in cross section.

First, an upper structure of the upper heat shield structure 100 includes the upper surface and its adjacent portion, and is mounted on an apparatus for growing a silicon single crystalline ingot. Thus, a basic structure of the upper structure is not variable. And, the upper structure has a lower significance in function for shielding heat emitted from the heater 200 than a lower structure including the lower surface 131 to 134. Accordingly, shapes and structures of the upper surface, a portion where the outer wall 110 meets the upper surface, and a portion where the inner wall 121 to 124 meets the upper surface may vary depending on structure of the apparatus for growing a silicon single crystalline ingot and mounting type of the upper heat shield structure 100 on the growth apparatus.

In this embodiment, the outer wall 110 extends substantially vertically relative to the surface of a silicon melt. And, the outer wall 110 extends downwards at predetermined angles of $\theta_1$ and $\theta_2$ sequentially from an upper part of the upper heat shield structure 100 and then extends vertically downwards. However, the present invention is not limited in this regard. For example, not a portion of the outer wall 110 but the whole of the outer wall 110 may extend downwards at a predetermined angle or extend vertically downwards.

In this embodiment, the inner wall includes four surfaces 121 to 124. A first slant surface 122 is located opposite to the outer wall 110 and extends substantially vertically downwards in the same way as the outer wall 110. A second slant surface 123 extends downwards from a lower end of the first slant surface 122 towards an ingot at a predetermined angle of $\theta_5$ relative to a horizontal plane. And, the inner wall includes an inner vertical surface 124 extending downwards substantially parallel to an ingot (substantially vertically relative to the silicon melt) from a lower end of the second slant surface 123. Further, a surface 121 where the first slant surface 122 meets the upper surface is a chamfered portion cut at a predetermined angle of $\theta_6$.

Meanwhile, as mentioned above, the inner wall except a part of the lower structure of the upper heat shield structure 100, i.e. the surfaces 121, 122 and 123 may be changeable. For example, the surface 121 where the first slant surface 122 meets the upper surface may be not chamfered. And, the surfaces 121 to 123 may be formed as a single slanted surface or may be formed having a predetermined curvature in the same way as the conventional upper heat shield structure 10 of FIG. 14(a). However, in almost every ingot growth apparatus, an interface between an ingot and a melt is observed by a CCD camera or a temperature sensor to measure the temperature of the interface and diameter of the ingot, and thus preferably the inner wall 121 to 124 extends slantly downwards towards the ingot.

In this embodiment, the lower surface 131 to 134 is an essence of the upper heat shield structure 100, and includes a lower slant surface 131 extending towards the inner wall from a lower end of the outer wall 110 and going away from the surface (horizontal plane) of a silicon melt at a first angle of $\theta_4$ relative to the surface of a silicon melt, a lower downward surface 132 extending downwards from an end of the lower slant surface 131 at the side of the inner wall, and a lower horizontal surface 133 extending substantially horizontally towards the inner vertical surface 124 from a lower end of the lower downward surface 132 and meets the inner vertical surface 124. And, preferably a surface 134 where the outer wall 110 meets the lower slant surface 131 is a chamfered portion cut at a second angle of $\theta_3$ or a rounded portion.

With regard to the shape and structure of the upper heat shield structure 100 according to this embodiment, preferable ranges and actual experimental values of design variables of FIG. 17 are shown in the following Table 2. However, the preferable ranges of Table 2 are for a silicon single crystalline ingot of 300 mm diameter, and the preferable ranges may vary depending on diameter of an ingot. And, it should be understood that the present invention may have modifications to the upper surface and its adjacent portion that form the upper structure of the upper heat shield structure 100.

TABLE 2

| Classification | Preferable range | | Value in |
|---|---|---|---|
| (unit) | Minimum | Maximum | embodiment |
| $D_O$(mm) | 645 | 789 | 717 |
| $D_I$(mm) | 566 | 692 | 629 |
| $H_T$(mm) | 378 | 463 | 421 |
| $H_1$(mm) | 233 | 285 | 258.6 |
| $H_2$(mm) | 59 | 72 | 65.5 |
| $W_T$(mm) | 236 | 289 | 262.5 |
| $W_1$(mm) | 113 | 139 | 126 |
| $W_2$(mm) | 129 | 157 | 143 |
| $\Theta_1$(degree) | 38 | 58 | 48 |
| $\Theta_2$(degree) | 10 | 14 | 12 |
| $\Theta_3$(degree) | 49 | 74 | 61.2 |
| $\Theta_4$(degree) | 2 | 8 | 5 |
| $\Theta_5$(degree) | 20 | 53 | 33.4 |
| $\Theta_6$(degree) | 17 | 26 | 21.6 |

Meanwhile, when the initial conditions or operation conditions of a silicon single crystalline ingot growth process using an ingot manufacturing apparatus having the above-mentioned upper heat shield structure 100 were controlled according to Table 3, it was found that CSD was not generated substantially. However, the preferable ranges of Table 3 are for a silicon single crystalline ingot of 300 mm diameter, and the preferable ranges may vary depending on diameter of an ingot.

TABLE 3

| Classification | Preferable range | | Value in | |
|---|---|---|---|---|
| (unit) | Minimum | Maximum | embodiment | Reference |
| g(mm) | 20 | 50 | 35 | Gap between a melt surface and an upper heat shield structure 100 (see FIG. 17(a)) |
| L(mm) | 100 | 150 | 115 | Distance between a melt surface and the top of a heater 200 (see FIG. 17(a)) |
| Crucible rotation speed (rpm) | 0.01 | 1.0 | 0.3~0.5 | Rotation speed of a container for a silicon melt |
| Seed rotation speed (rpm) | 5.0 | 10.0 | 5.0~10.0 | Rotation speed of a silicon ingot |
| Ratio of rotation speed | 5 | 50 | 10~33 | (Seed rotation speed)/(Crucible rotation speed) |
| Intensity of a magnetic field (Gauss) | 1000 | 4000 | 1500~2000 | Maximum intensity of a horizontal magnetic field |
| Pulling speed (mm/min) | 0.5 | 1.0 | 0.75~0.85 | Pulling speed of a silicon ingot |

Figure 18:
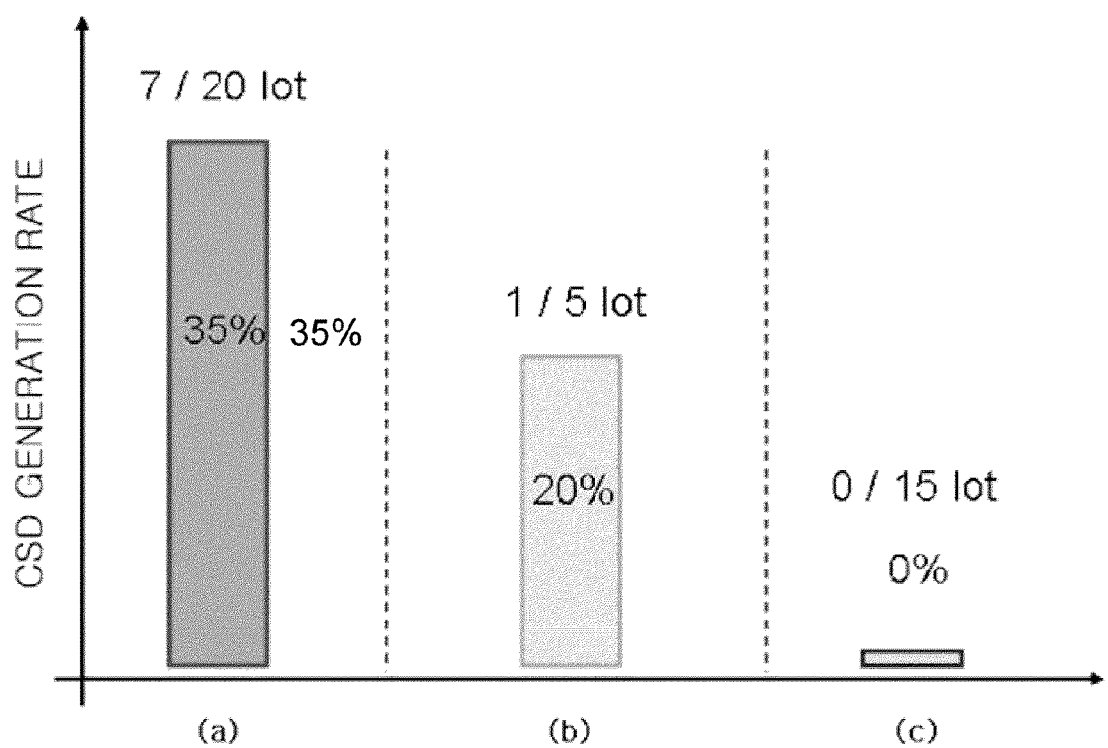
FIG. 18 is a graph showing the effect of the present invention.

As shown in FIG. 18(*c*), a silicon single crystalline ingot of 300 mm diameter was grown using the upper heat shield structure 100 of the above-mentioned embodiment and initial conditions and operation conditions of a silicon single crystalline ingot growth process set according to Table 3, and then fifteen ingots were sliced and polished to obtain fifteen lots of silicon ingots. CSD was not detected in the obtained wafers. It was inferred that as process conditions were changed, $\Delta T$ ($T_m - T^I$) was changed, and as a result, CSD was not generated.

Figure 19:
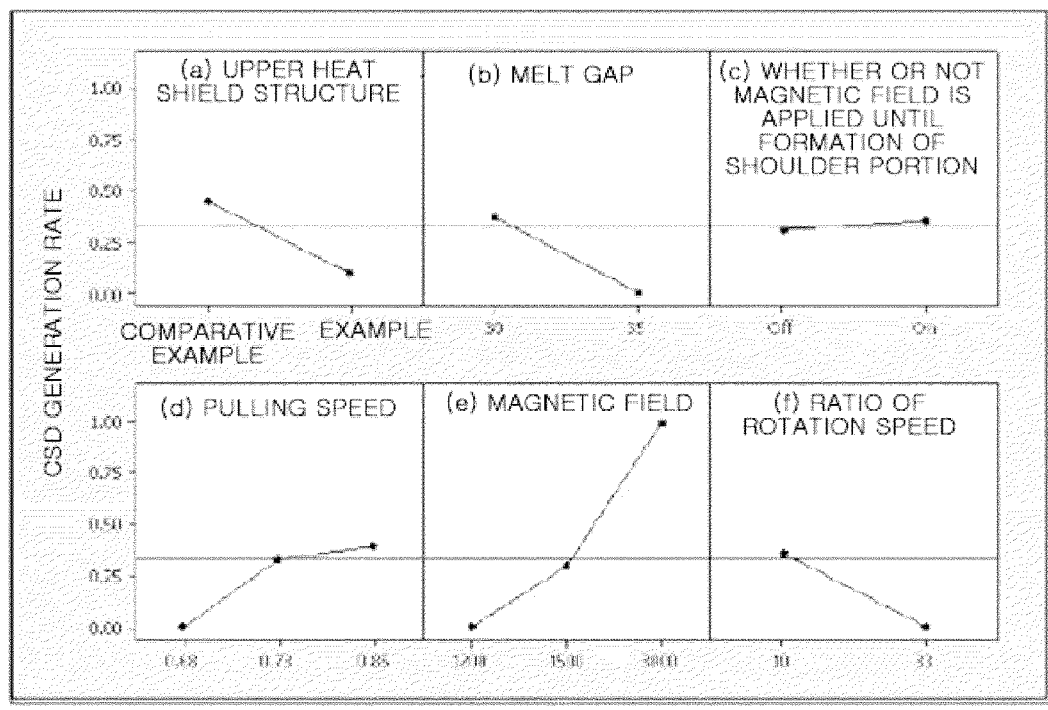
FIG. 19 is a graph showing a CSD reduction effect depending on changes in structure of an upper heat shield structure and process conditions of a silicon single crystal growth process according to the present invention.

Meanwhile, FIG. 19 is a graph illustrating the effect of independent control of the initial conditions or operation conditions shown in Table 3. FIG. 19(*a*) indicates a type of an upper heat shield structure, FIG. 19(*b*) indicates a gap (g) between a silicon melt and an upper heat shield structure, FIG. 19(*c*) indicates whether or not a horizontal magnetic field is applied when pulling up an initial portion (from a neck portion to a shoulder portion) prior to formation of a body portion of a silicon ingot (after a body portion is formed in both cases, a horizontal magnetic field is applied), FIG. 19(*d*) indicates a pulling speed of an ingot, FIG. 19(*e*) indicates a maximum intensity of a horizontal magnetic field, and FIG. 19(*f*) indicates a ratio of a seed rotation speed to a crucible rotation speed. Meanwhile, a horizontal line in the middle of the graph indicates an average CSD generation rate (CSD occurred to eight lots among twenty five lots, that is, 0.32) of FIGS. 18(*a*) and (*b*).

It was found through FIG. 19 that except (c) whether or not a horizontal magnetic field is applied at the initial stage of pulling up a silicon ingot (until a stage of pulling up a shoulder portion), a structure of an upper heat shield structure or each process conditions was controlled in the range of the present invention to remarkably reduce CSD.

Meanwhile, instead of control of a structure of an upper heat shield structure or each process conditions, impurity for preventing propagation of dislocation may be introduced into a silicon melt that is a material of a silicon single crystalline ingot. That is, the dopant concentration C of the above-mentioned Equation 1 is controlled to change $\Delta T$ ($T_m - T^I$), and consequently generation of CSD is controlled. The impurity for preventing propagation of dislocation may include carbon, nitrogen or oxygen, and preferably its concentration may have the range of 5E14~2E16, 5E13~3E14 or 1E17~1E18 atoms/cc, respectively. The impurity may be introduced into a silicon melt through various methods. However, in the case that impurity is carbon or nitrogen, it is convenient to add a silicon wafer coated with SiC or SiN to a multicrystalline silicon solid raw material for a silicon melt with the above-mentioned predetermined concentration. And, in the case that impurity is oxygen, oxygen is provided from a quartz crucible during melting a multicrystalline silicon solid raw material, and thus a separate providing means is not needed.

Figure 20:
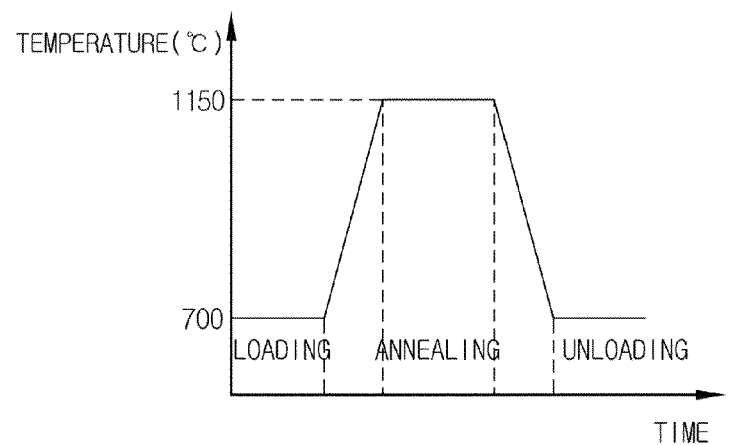
FIG. 20 is a diagram showing a heat treating process in the case of impurity doping for preventing propagation of a screw dislocation according to an embodiment of the present invention.

In the case that impurity for preventing propagation of dislocation is added as mentioned above, it is preferable to heat-treat a resultant silicon wafer as shown in FIG. 20. That is, a silicon wafer is loaded into a heat treating furnace, temperature in the furnace is increased to 1050~1180° C. with a temperature increasing rate of 3 to 5° C./sec, and the silicon wafer is heat-treated with a target temperature (1150° C. in this embodiment) for 5 to 10 minutes. After the heat treating, temperature in the furnace is decreased to, for example, 700° C. with a temperature decreasing rate of 3 to 5° C./sec, and the wafer is unloaded. When the wafer is loaded and unloaded, the inside of the heat treating furnace is ventilated by an inert gas such as argon. And, when increasing and decreasing temperature and heat treating the silicon wafer, an atmosphere gas such as hydrogen, oxygen, nitrogen and argon gas may be provided with pressure of about 100 to 760 Torr.

The heat treating allows the added impurity to serve as a dislocation locking site, thereby obtaining a silicon wafer free of CSD which may be generated during growth of a silicon single crystalline ingot.

As such, the present invention can provide a silicon single crystalline ingot free of CSD that is generated due to a screw dislocation caused by a strong horizontal magnetic field. And, according to the present invention, the silicon single crystalline ingot of the present invention is sliced and polished to obtain a silicon wafer that is substantially free of CSD. Further, according to the present invention, an epitaxial layer is grown on the silicon wafer to obtain a silicon epitaxial wafer that is substantially free of CSD.

Meanwhile, a process for obtaining a silicon wafer from a silicon single crystalline ingot or a process for obtaining a silicon epitaxial wafer from a silicon wafer may use a technique known well in the art, and its detailed description is omitted.

The effects of the present invention are as follows.

First, the present invention uses an apparatus for manufacturing a silicon single crystalline ingot with a unique upper heat shield structure to reduce generation of a screw dislocation caused by a strong horizontal magnetic field and prevent the generated screw dislocation from propagating into a cross slip.

And, a process for manufacturing a silicon single crystalline ingot according to the present invention controls initial conditions or operation conditions of a silicon single crystalline ingot growth process to reduce generation of a screw dislocation caused by a strong horizontal magnetic field and prevent the generated screw dislocation from propagating into a cross slip.

Therefore, the present invention uses a HMCZ method in manufacturing a silicon wafer to meet the trend of larger diameter of the silicon wafer, and thus can provide a high-quality large-diameter silicon single crystalline ingot, a high-quality large-diameter silicon wafer and a high-quality large-diameter silicon epitaxial wafer that control a cross slip dislocation to reduce a fault rate of a resultant semiconductor device.

Hereinabove, preferred embodiments of the present invention has been described in detail with reference to the accompanying drawings. However, it should be understood that the detailed description and specific examples, while indicating preferred embodiments of the invention, are given by way of illustration only, since various changes and modifications within the spirit and scope of the invention will become apparent to those skilled in the art from this detailed description.

What is claimed is:

1. A process for manufacturing a silicon single crystalline ingot in an apparatus for manufacturing a silicon single crystalline ingot by a HMCZ (Horizontal Magnetic Czochralski) method, the apparatus comprising an upper heat shield structure, the upper heat shield structure being spaced apart with a predetermined gap from a surface of a silicon melt contained in a crucible and arranged around a silicon single crystalline ingot pulled from the silicon melt, and the upper heat shield structure having a cross section taken in the lengthwise direction of the ingot, the cross section including, an outer wall extending vertically or slantly relative to the surface of the silicon melt, an inner wall having an inner slant surface facing the ingot opposite to the outer wall and approaching to the ingot downwards, and an inner vertical surface extending substantially vertically downwards from a lower end of the inner slant surface, and a lower surface having a lower slant surface extending towards the inner wall from a lower end of the outer wall and going away from the surface of the silicon melt at a first angle relative to the surface of the silicon melt, a lower downward surface extending downwards from an end of the lower slant surface at the side of the inner wall, and a lower horizontal surface extending substantially horizontally towards the inner vertical surface from a lower end of the lower downward surface and meeting the inner vertical surface, wherein the first angle is 2° to 8°, so that a screw dislocation which may be generated in the silicon single crystalline ingot due to the HMCZ method is controlled, said process comprising:

preparing a silicon melt by putting silicon solid raw material in the crucible of the apparatus and heating the silicon solid raw material using a heater arranged around the crucible to melt the silicon solid raw material; and applying a horizontal magnetic field to the silicon melt received in the crucible and pulling up a silicon single crystalline ingot from the silicon melt using a silicon single crystalline seed, whereby the process controls a screw dislocation that may be generated in the silicon single crystalline ingot due to a HMCZ method.

2. The process for manufacturing a silicon single crystalline ingot according to claim 1, wherein a gap between the upper heat shield structure and a surface of the silicon melt is maintained between 20 mm and 50 mm while the silicon single crystalline ingot is pulled up.

3. The process for manufacturing a silicon single crystalline ingot according to claim 1, wherein a height from the surface of the silicon melt to a top of the heater arranged around the crucible is maintained between 100 mm and 150 mm while the silicon single crystalline ingot is pulled up.

4. The process for manufacturing a silicon single crystalline ingot according to claim 1, wherein the crucible is rotated at a speed between 0.01 rpm and 1.0 rpm, and the ingot is rotated at a speed between 5.0 rpm and 10.0 rpm in the direction opposite to a rotation direction of the crucible while the silicon single crystalline ingot is pulled up.

5. The process for manufacturing a silicon single crystalline ingot according to claim 4, wherein a ratio of the ingot rotation speed to the crucible rotation speed is between 5 and 50.

6. The process for manufacturing a silicon single crystalline ingot according to claim 1, wherein the horizontal magnetic field is applied to the silicon melt with an intensity between 1000 Gauss and 4000 Gauss while the silicon single crystalline ingot is pulled up.

7. The process for manufacturing a silicon single crystalline ingot according to claim 1,
   wherein carbon, nitrogen or oxygen as an impurity is added to the silicon melt with a concentration of 5E14~2E16, 5E13~3E14 or 1E17~1E18 atoms/cc, respectively.

8. A process for manufacturing a silicon wafer, comprising:
   slicing the silicon single crystalline ingot manufactured by the process defined in claim 7 to obtain a silicon wafer; and
   heat-treating the silicon wafer with a temperature between 1030° C. and 1180° C. for 5 to 10 minutes.

9. The process for manufacturing a silicon single crystalline ingot according to claim 1,
   wherein a pulling speed of the silicon single crystalline ingot is maintained between 0.5 mm/min and 1.0 mm/min.

* * * * *